US010725486B2

(12) United States Patent
Fang et al.

(10) Patent No.: US 10,725,486 B2
(45) Date of Patent: Jul. 28, 2020

(54) REFERENCE VOLTAGE GENERATOR

(71) Applicant: Novatek Microelectronics Corp., Hsinchu (TW)

(72) Inventors: Yong-Ren Fang, Kaohsiung (TW); Shen-Iuan Liu, Taipei (TW); Ju-Lin Huang, Hsinchu County (TW); Tzu-Chien Tzeng, Hsinchu (TW); Keko-Chun Liang, Hsinchu (TW); Yu-Hsiang Wang, Hsinchu (TW); Che-Wei Yeh, New Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/052,654

(22) Filed: Aug. 2, 2018

(65) Prior Publication Data
US 2019/0113939 A1    Apr. 18, 2019

Related U.S. Application Data

(60) Provisional application No. 62/540,071, filed on Aug. 2, 2017.

(51) Int. Cl.
*G05F 1/46* (2006.01)
*H03K 5/24* (2006.01)
*G01R 19/165* (2006.01)

(52) U.S. Cl.
CPC ......... *G05F 1/46* (2013.01); *G01R 19/16528* (2013.01); *H03K 5/24* (2013.01)

(58) Field of Classification Search
CPC .... G05F 1/10; G05F 1/46; H03K 5/22; H03K 5/24
See application file for complete search history.

(56) References Cited

U.S. PATENT DOCUMENTS 5,058,130 A     10/1991 Park
5,995,011 A  *  11/1999 Kurihara .......... G01R 19/16528
                                                        340/663
(Continued)

FOREIGN PATENT DOCUMENTS

CN             106656876           5/2017

OTHER PUBLICATIONS

"Office Action of China Counterpart Application," dated Dec. 18, 2019, p. 1-p. 9.

*Primary Examiner* — Lincoln D Donovan
*Assistant Examiner* — Diana J Cheng
(74) *Attorney, Agent, or Firm* — JCIPRNET

(57) ABSTRACT

A reference voltage generator includes a detecting voltage provider, a comparator, and a core circuit. The detecting voltage provider provides a detecting voltage with a first voltage level corresponding to a voltage coefficient. The comparator compares the first voltage level of the detecting voltage with a plurality of sampled amplitudes of an input signal to respectively generate a plurality of comparison results. The core circuit is used to: collect a plurality of first comparison results associated with a current received bit of a preset value from the comparison results; take the voltage coefficient as a first boundary voltage coefficient in response to the first comparison results satisfying a first condition; take the voltage coefficient as a second boundary voltage coefficient in response to the first comparison results satisfying a second condition. The reference circuit generates a reference voltage according to the first and second boundary voltage coefficients.

24 Claims, 13 Drawing Sheets

(56) References Cited

U.S. PATENT DOCUMENTS 9,564,863 B1 2/2017 Giridharan
9,722,820 B1 8/2017 Hekmat et al.

* cited by examiner

REFERENCE VOLTAGE GENERATOR

CROSS-REFERENCE TO RELATED APPLICATION

This application claims the priority benefit of U.S. provisional application Ser. No. 62/540,071, filed on Aug. 2, 2017. The entirety of the above-mentioned patent application is hereby incorporated by reference herein and made a part of this specification.

FIELD OF THE DISCLOSURE

The disclosure relates to a reference voltage generator, and more particularly, to a reference voltage generator for providing a reference voltage to an equalizer.

DESCRIPTION OF RELATED ART

In the design of a decision feedback equalizer (DFE) applied in a signal receiver, a sign-sign least mean square (SSLMS) algorithm is usually applied in the chip design for determining tap coefficients in the decision feedback equalizer. The SSLMS algorithm can be implemented through a digital circuit. In the SSLMS algorithm, a difference e[t] between an amplitude (denoted by y[t]) of an output signal y(t) and a reference signal d[t] needs to be calculated. Coefficients in the decision feedback equalizer can be adjusted according to a size of the difference e[t].

In general, an SSLMS algorithm circuit requires a positive reference voltage +d[t] and a negative reference voltage −d[t]. The positive reference voltage +d[t] is applied when a current received bit is 1, and the negative reference voltage −d[t] is applied when the current received bit is 0. It should be noted that, the positive or the negative reference voltage does not refer to the actual reference voltage being a positive voltage or a negative voltage but refers to a relative value based on a threshold value Vth. The reference voltage above the threshold voltage Vth is regarded as the positive reference voltage +d[t], and the reference voltage below the threshold voltage Vth is regarded as the negative reference voltage −d[t].

The following description refers to a hardware architecture diagram of the SSLMS algorithm circuit illustrated in FIG. 1 and a hardware architecture diagram of the decision feedback equalizer illustrated in FIG. 2. In FIG. 1, an SSLMS algorithm circuit 100 is composed of adders 110 and 120, operators AD1 to ADN, a selector 130 and counters 141 to 14N. The selector 130 performs a selecting action according to a current received bit h[t]. The operators AD1 to ADN take an output of the selector 130 to be calculated with previous received bits h[t−1] to h[t−N], respectively. Then, the counters 141 to 14N respectively generate tap coefficients Tap1 to TapN based on a counting action of a clock signal CK.

In FIG. 2, a decision feedback equalizer 200 is composed of a slicer 210, an operator AD21, delay cells 220 to 240 and output drivers OD1 to OD3. The decision feedback equalizer 200 is 3-taps decision feedback equalizer. The operator AD21 takes lossy data LD to be calculated with outputs of the output drivers OD1 to OD3 to generate the output signal y(t) of the decision feedback equalizer. The slicer 210 determines whether a digital value currently corresponding to the output signal y(t) is bit 0 or bit 1. The delay cells 220 to 240 delay a plurality of bits received in sequence, so as to obtain a current received bit h0 and previous received bits h1, h2 and h3, respectively.

In the conventional design of the decision feedback equalizer, the reference voltage d[t] required by the SSLMS algorithm circuit is normally a fixed value that is unadjustable or only adjustable manually, which is unable to adapt to various situations. Although there is another approach in the conventional technology which adopts an analog circuit to automatically search for an optimized reference voltage, such approach cannot operate under high channel loss data.

SUMMARY

The disclosure provides a reference voltage generator capable of generating a reference voltage to an equalizer.

The reference voltage generator is adapted to the equalizer. The reference voltage generator includes a detecting voltage provider, a comparator, and a core circuit. The detecting voltage provider is configured to provide a detecting voltage, and the detecting voltage has a first voltage level corresponding to a voltage coefficient. The comparator is coupled to the detecting voltage provider, and configured to compare the first voltage level of the detecting voltage with a plurality of sampled amplitudes of an input signal to respectively generate a plurality of comparison results. The core circuit is coupled to the detecting voltage provider and the comparator. The core circuit is used to: collect a plurality of first comparison results associated with a current received bit of a preset value from the comparison results; take the voltage coefficient as a first boundary voltage coefficient in response to the first comparison results satisfying a first condition; take the voltage coefficient as a second boundary voltage coefficient in response to the first comparison results satisfying a second condition; when none or merely one of conditions among the first condition and the second condition occurred, generate the voltage coefficient corresponding to a second voltage level, and output the voltage coefficient corresponding to the second voltage level to the detecting voltage provider. Here, the first voltage level is different from the second voltage level. Here, the reference voltage generator generates a reference voltage for the equalizer according to the first boundary voltage coefficient and the second boundary voltage coefficient.

Another reference voltage generator of the disclosure includes a detecting voltage provider, a comparator, and a core circuit. The detecting voltage provider is configured to provide a detecting voltage, and the detecting voltage has a first voltage level corresponding to a voltage coefficient. The comparator is coupled to the detecting voltage provider, and configured to compare the first voltage level of the detecting voltage with a plurality of sampled amplitudes of an input signal to respectively generate a plurality of comparison results. The core circuit is coupled to the detecting voltage provider and the comparator. The core circuit is used to: collect a plurality of first comparison results associated with a current received bit of a preset value from the comparison results; take the voltage coefficient as a first boundary voltage coefficient in response to the first comparison results satisfying a first condition; take the voltage coefficient as a second boundary voltage coefficient in response to the first comparison results satisfying a second condition; replace the second boundary voltage coefficient by the voltage coefficient in response to two situations below being true: (1) a second comparison result corresponding to the current received bit satisfies a third condition, and (2) a plurality of received bits match a preconfigured bit sequence pattern; when none or merely one of conditions among the first condition and the second condition occurred, or when both the first condition and the second condition already occurred and yet at least one of the situations (1) and (2) is not true, generate the voltage coefficient corresponding to a second voltage level, and output the voltage coefficient corresponding to the second voltage level to the detecting voltage provider. Here, the first voltage level is different from the second voltage level. Here, the reference voltage generator generates a reference voltage for the equalizer according to the first boundary voltage coefficient and the second boundary voltage coefficient.

Based on above, according to the disclosure, the detecting voltage is used to find the boundary voltage of the input signal so the reference voltage can be calculated according to the boundary voltage. As a result, the reference voltage generator can generate an accurate reference voltage to the equalizer to improve a working performance of the equalizer.

To make the above features and advantages of the disclosure more comprehensible, several embodiments accompanied with drawings are described in detail as follows.

DESCRIPTION OF THE PREFERRED EMBODIMENTS

Figure 1:
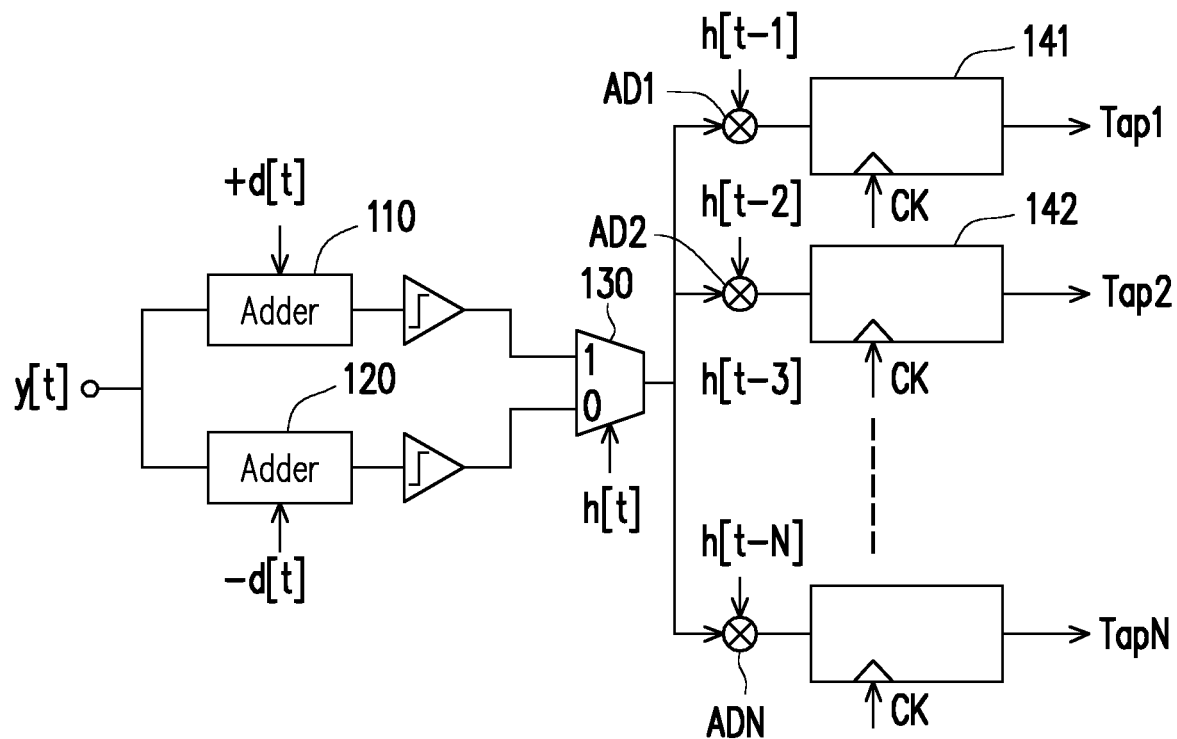
FIG. 1 is a hardware architecture diagram illustrating the SSLMS algorithm circuit.
Figure 2:
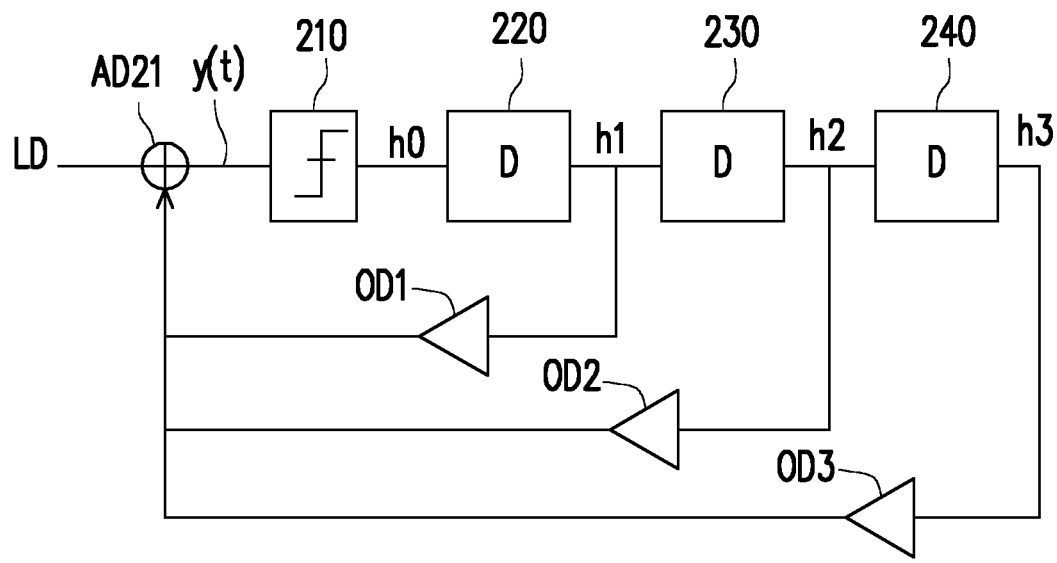
FIG. 2 illustrates a hardware architecture diagram of the decision feedback equalizer.

With reference to the decision feedback equalizer of FIG. 2, when the output signal y(t) is a random signal with a bit sequence in uniform distribution such as a pseudo random binary sequence (PRBS), the minimum expectation of $|e(t)|2$ can be represented by $\text{Min}\{E[|e(t)|2]\}$. In a condition where the output signal y(t) may have N possible amplitudes (N is a positive integer), $\text{Min}\{E[|e(t)|2]\}$ may be expressed as:

$$\text{Min}\{E[|e[t]|^2]\} \to \text{Min}\{E[|d[t] - ya[t]|^2\}, e[t] = d[t] - y[[t]$$

$$\to \text{Min}\left\{\sum_{t=1}^{N}(d[t] - (y[t]))^2\right\}$$

$$\to \text{Min}\left\{\left(N \times d[t]^2 + \sum_{t=1}^{N}\left(\frac{1}{N} \times y[t]\right)^2 - 2d[t] \times \sum_{t=1}^{N}\left(\frac{1}{N} \times y[t]\right)\right)\right\}$$

By operating derivative operation on the mathematical formula and setting the derivative of the above mathematical formula to be equal to 0, a mathematical formula can be $$\frac{1}{N}\left(2 \times \sum_{t=1}^{N} y[t] - 2d[t]\right) = 0$$

$$\to \frac{1}{N}\sum_{t=1}^{N} y[t] = d[t]$$

It can be known that, the optimized reference voltage d[t] is equal to an average value of sampled amplitudes y[t] of the output signal of the decision feedback equalizer, and the reference voltage generator of the disclosure is designed accordingly.

y(t) shown in FIG. 2 is called the output signal based on the viewpoint of the decision feedback equalizer. However, in the reference voltage generator according to an embodiment of the disclosure, y(t) output by the decision feedback equalizer is an input signal for the reference voltage generator. Therefore, in the following description, y(t) is referred to as the input signal, and y[t] is referred to as the sampled amplitudes of the input signal, or simply, input signal amplitudes.

Figure 3:
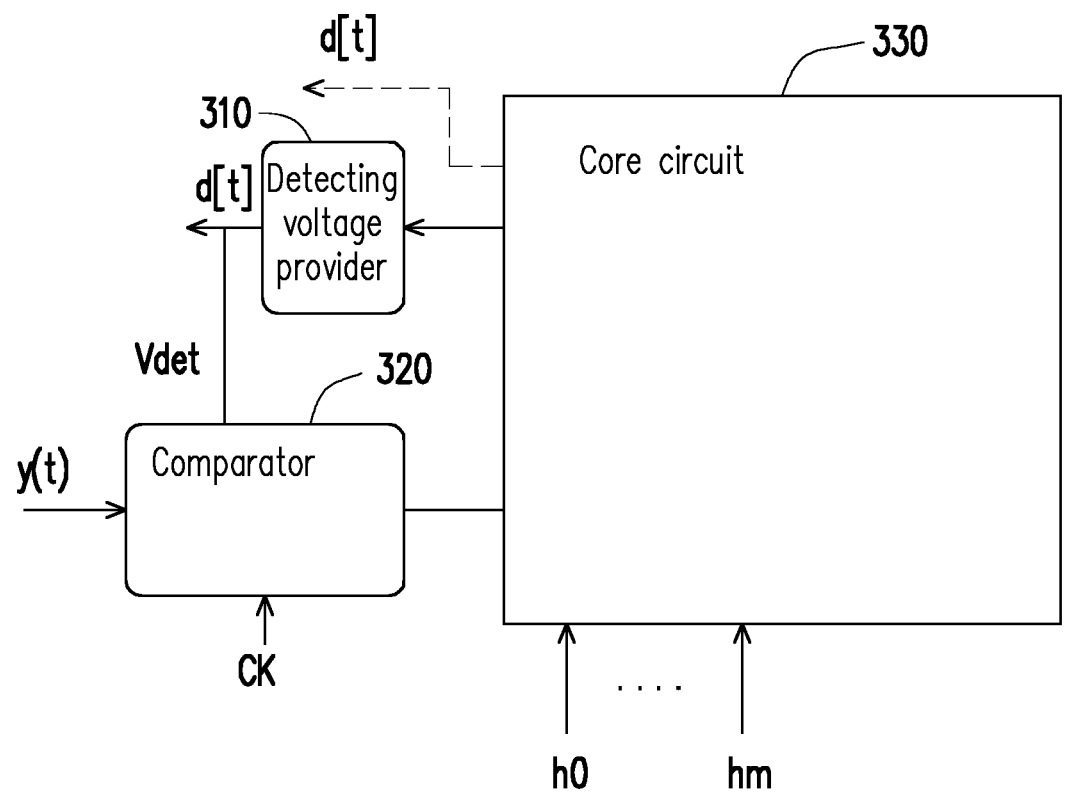
FIG. 3 is a schematic diagram illustrating a reference voltage generator according to an embodiment of the disclosure.

With reference to FIG. 3, FIG. 3 is a schematic diagram illustrating a reference voltage generator according to an embodiment of the disclosure. A reference voltage generator 300 includes a detecting voltage provider 310, a comparator 320, and a core circuit 330. The detecting voltage provider 310 is configured to provide a detecting voltage Vdet. The detecting voltage provider 310 can set a voltage level of the detecting voltage Vdet according to a voltage coefficient. The comparator 320 is coupled to the detecting voltage provider 310, and the comparator 320 is configured to compare a first voltage level (which has the corresponding voltage coefficient) of the detecting voltage Vdet with the sampled amplitudes y[t] of the input signal y(t) to respectively generate a plurality of comparison results. In this embodiment, the input signal y(t) may be a periodic clock signal. The comparator 320 can sample the input signal y(t) according to a sampling clock signal CK to obtain the sampled amplitudes y[t] of the input signal y(t). Based on the sampling clock signal CK, the comparator 320 compares the first voltage level of the detecting voltage Vdet with the sampled amplitudes y[t] to respectively generate the comparison results. The voltage level of the detecting voltage Vdet is adjustable. In a complete reference voltage detection process, the detecting voltage Vdet is adjusted step by step from high to low or from low to high within a permissible voltage range (i.e., a predetermined range from a maximum detecting voltage level to a minimum detecting voltage level). When the detecting voltage Vdet is at the first voltage level within the permissible voltage range, it may be regarded as one detecting voltage scan cycle, and when the detecting voltage Vdet is adjusted to another voltage level different from the first voltage level, it may be regarded as another detecting voltage scan cycle.

The core circuit 330 is coupled to the detecting voltage provider 310 and the comparator 320. The core circuit 330 is configured to collect a plurality of first comparison results associated with the current received bit h0 of a preset value from the comparison results generated by the comparator 320 (within the same detecting voltage scan cycle). Here, the preset value may be bit 1 or bit 0. When the reference voltage generated by the reference voltage generator 300 is the positive reference voltage, the preset value is bit 1, and the current received bit h0 associated with bit 1 means that the current received bit h0 is bit 1; and when the reference voltage generated by the reference voltage generator 300 is the negative reference voltage, the preset value is bit 0, and the current received bit h0 associated with bit 0 means that the current received bit h0 is bit 0. The number of the first comparison results is a predetermined value (e.g., 64 first comparison results). The core circuit 330 can determine whether the first comparison results satisfy a first condition, and take the voltage coefficient of the corresponding detecting voltage Vdet as a first boundary voltage coefficient in response to the first comparison results satisfying the first condition. The reason for this is that, when the first comparison results are determined as satisfying the first condition, the voltage level of the current detecting voltage Vdet may be regarded as an approximation of the sampled amplitudes y[t] (e.g., a maximum value or a minimum value of the sampled amplitudes y[t)]). After determining that the first condition occurred, the core circuit 330 determines whether a plurality of first comparison results obtained from a subsequent detecting voltage scan cycle satisfy a second condition, and takes the voltage coefficient of the corresponding detecting voltage Vdet as a second boundary voltage coefficient in response to the first comparison results satisfying the second condition. It should be noted that, for the first comparison results with a fixed quantity collected from a comparison according to the same detecting voltage level and the input signal sampled amplitudes, the core circuit 330 uses not only the first condition but also the second condition to determine the first comparison results. For the core circuit 330, the second condition is only used when the first condition have already occurred. When the second condition is used by the core circuit 330, it means that the first comparison results to be determined at the time are obtained from a different detecting voltage scan cycle. On the other hand, when none of the first condition and the second condition occurred or merely one of the first condition and the second condition occurred, the core circuit 330 changes the voltage coefficient so the detecting voltage provider 310 can generate the detecting voltage Vdet having a second voltage level according to the updated voltage coefficient. Here, the first voltage level is different from the second voltage level. By adjusting the voltage coefficient, the detecting voltage provider 310 can dynamically adjust the detecting voltage Vdet to perform multiple detecting voltage scan cycles, and continue or end actions of the detecting voltage scan cycles according to the occurrence state of the first condition and the second condition.

After obtaining the first boundary voltage coefficient and the second boundary voltage coefficient, the reference voltage generator 300 generates the reference voltage d[t] according to the first boundary voltage coefficient and the second boundary voltage coefficient, and provides the reference voltage d[t] to the corresponding equalizer. In an embodiment of the disclosure, the reference voltage generator 300 can generate the reference voltage (the reference voltage required in the SSLMS algorithm) to the decision feedback equalizer based on a reference voltage coefficient calculated from the first boundary voltage coefficient and the second boundary voltage coefficient.

The core circuit 330 further receives the current received bit h0 and previous received bits h1 to hm from the decision feedback equalizer. In an embodiment of the disclosure, the reference voltage d[t] may be generated through the detecting voltage provider 310, and may also be generated through the core circuit 330.

Figure 4A:
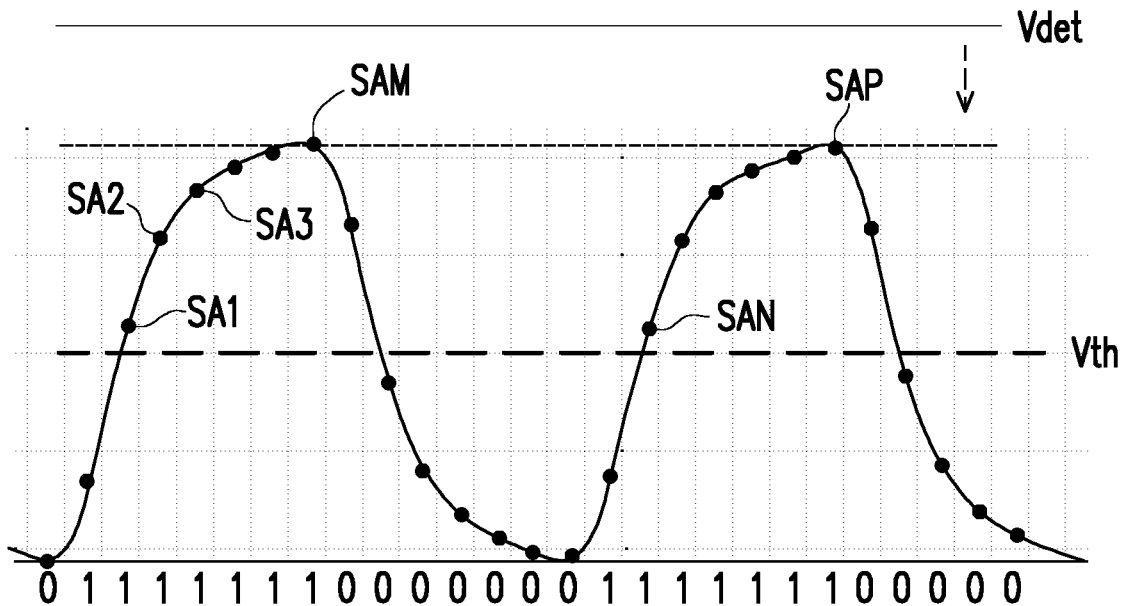
FIG. 4A to FIG. 4C are schematic diagrams illustrating actions in a detecting voltage scan cycle of the reference voltage generator according to an embodiment of the disclosure.
Figure 4B:
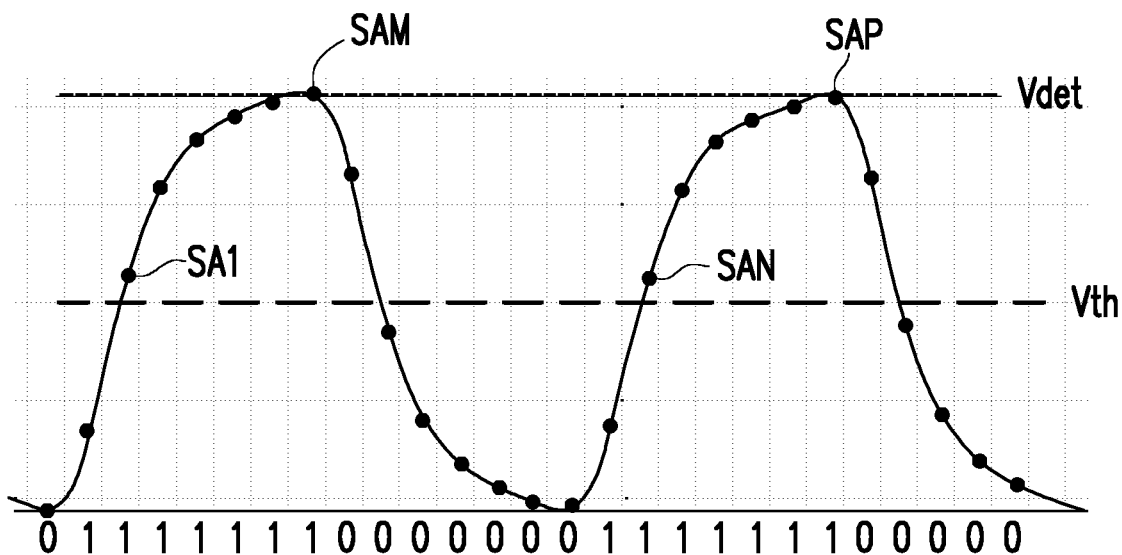
Figure 4C:
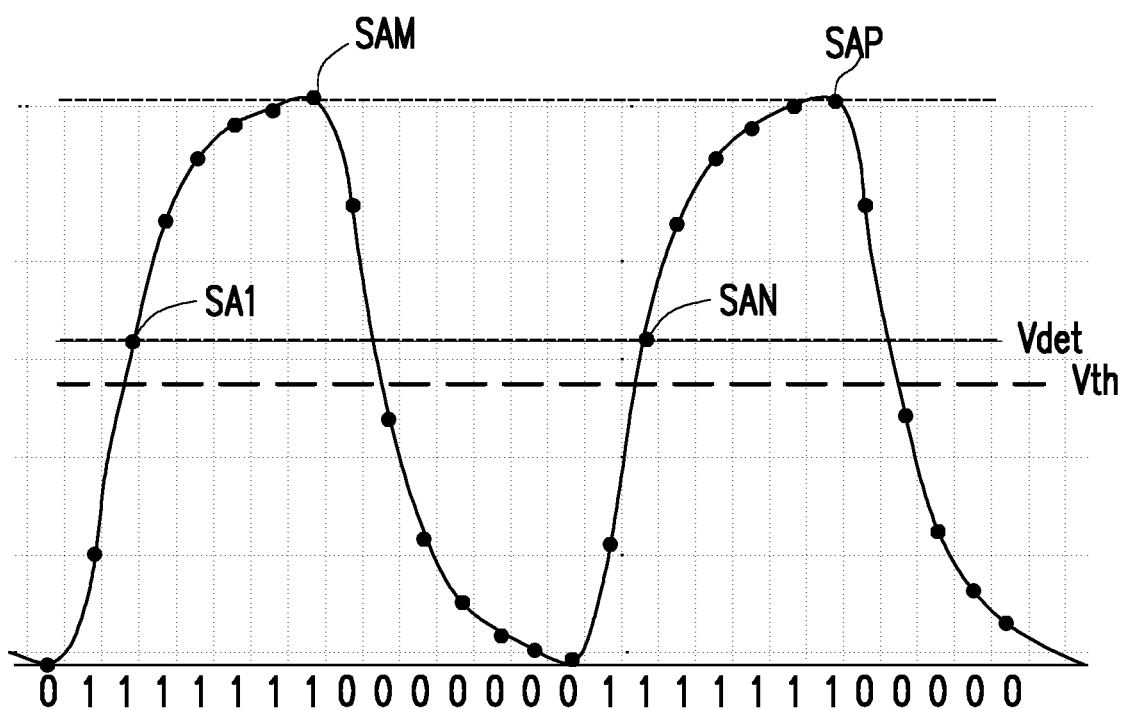

Detailed operating method of the reference voltage generator 300 may refer to FIG. 3 and FIG. 4A to FIG. 4C altogether. Among them, FIG. 4A to FIG. 4C are schematic diagrams illustrating actions in the detecting voltage scan cycle of the reference voltage generator 300 according to an embodiment of the disclosure. Bit sequences shown in FIG. 4A to FIG. 4C and other similar waveform diagrams provided later indicate bits transmitted by a signal transmitter. However, due to influences from the channel environment, the decision feedback equalizer (located in the signal receiver) may not receive ideal transmitted bits for sure, but may receive corresponding bits of a distorted signal instead. Whether the received bits recognized by the decision feedback equalizer is 0 or 1 is determined by comparing the sampled amplitudes of the received signal with the threshold voltage Vth. The input signal y(t) of the reference voltage generator corresponds to multiple sampled amplitudes within a period of time. For example, within a time range shown by FIG. 4A, a part of sampled amplitudes SA1 to SAP has the voltage level greater than the threshold voltage Vth and the corresponding received bit being bit 1; and another part of sampled amplitudes has the voltage level less than the threshold voltage Vth and the corresponding received bit being bit 0. In view of FIG. 4A, it can be known that, the bits transmitted by the signal transmitter are not necessarily equal to the received bits recognized by the feedback equalizer.

The voltage level of the detecting voltage Vdet may be set according to the voltage coefficient. In this embodiment, a plurality of voltage coefficients may be preset to correspond to a plurality of voltage levels within the permissible voltage range of the detecting voltage Vdet. The voltage coefficient may be a digital signal, and the detecting voltage provider 310 may be a digital-to-analog conversion circuit that determines the voltage level of the detecting voltage Vdet by converting the voltage coefficient. When the positive reference voltage +d[t] is to be obtained, the detecting voltage provider 310 can initially output the detecting voltage Vdet with a relatively high voltage level, and perform a plurality of detecting voltage scan cycles by gradually decreasing the voltage level of the detecting voltage Vdet. In each of the detecting voltage scan cycles, the comparator 320 compares the voltage level of the detecting voltage Vdet with the sampled amplitudes of the input signal y(t) to generate a plurality of comparison results. The comparison result is, for example, a logic value 1 or a logic value 0. Here, the logic value 1 indicates that the detecting voltage Vdet is greater than the corresponding sampled amplitude y[t], and the logic value 0 indicates that the detecting voltage Vdet is less than or equal to the corresponding sampled amplitude y[t]. Because the sampled amplitude may correspond to a received bit 1 or a received bit 0, the comparison results described above also include comparison results corresponding to the received bit 1 or the received bit 0. When the positive reference +d[t] is to be obtained, after receiving the comparison results, the core circuit 330 determines whether the corresponding current received bit is 1 or 0 in the comparison result one by one. In this case, the core circuit 330 ignores the comparison results corresponding to the current received bit being 0 and collects only the comparison results corresponding to the current received bit being 1 to be regarded as valid comparison results (i.e., a plurality of the first comparison results associated with the current received bit of the preset value being the bit 1 in the above description of FIG. 3).

Conversely, when the negative reference −d[t] is to be obtained, after receiving the comparison results, the core circuit 330 determines whether the corresponding current received bit is 1 or 0 in the comparison result one by one. In this case, the core circuit 330 ignores the comparison results corresponding to the current received bit being 1 and collects only the comparison results corresponding to the current received bit being 0 to be regarded as valid comparison results (i.e., a plurality of the first comparison results associated with the current received bit of the preset value being the bit 0 in the above description of FIG. 3).

In each of the detecting voltage scan cycles, the core circuit 330 proceeds to the subsequent action of determining whether the maximum value of the input signal sampled amplitudes is found only when the number of the first comparison results collected by the core circuit 330 reaches one preconfigured quantity (e.g., equal to 64).

With reference to FIG. 4A, the detecting voltage provider 310 initially outputs the detecting voltage Vdet with the relatively high voltage level, and performs the detecting voltage scan cycles by gradually decreasing the voltage level of the detecting voltage Vdet. Once the first detecting voltage scan cycle (in which the detecting voltage Vdet has an initial voltage level that is relatively high, such as the maximum value or the approximation of the maximum value within the permissible voltage range) is started, each time when the number of the first comparison results collected reaches the fixed quantity, the core circuit 330 determines whether these first comparison results satisfy the first condition, and generates a resultant signal for indicating whether the first condition is satisfied or not. The first condition is all of a plurality of first comparison results in a previous ((i−1)$^{th}$) detecting voltage scan cycle indicating that the voltage level of the detecting voltage Vdet is greater than the corresponding input signal sampled amplitude (e.g., all of the first comparison results are the logic value 1), being changed to at least one of the first comparison results in a current (i$^{th}$) detecting voltage scan cycle indicating that the voltage level of the detecting voltage Vdet is less than or equal to the corresponding sampled amplitude (e.g., most of the first comparison results are the logic value 1 and at least one of the first comparison results is the logic value 0).

In continuous (i−1) detecting voltage scan cycles with the detecting voltage Vdet gradually decreased starting from an initial voltage level, when the voltage level of the detecting voltage Vdet is greater than all the sampled amplitudes SA1 to SAP corresponding the received bit 1, the core circuit 330 can learn that the first comparison results do not satisfy the first condition. In this case, the core circuit 330 determines that the maximum value of the input signal sampled amplitudes is not found yet. Then, the core circuit 330 decreases the voltage coefficient by one step to be output to the detecting voltage provider 310 so the detecting voltage provider 310 can generate the detecting voltage Vdet of another voltage level for the next detecting voltage scan cycle.

Next, with reference to FIG. 4B, after a total of (i−1) detecting voltage scan cycles with the detecting voltage Vdet starting from the initial voltage level are completed, when the core circuit 330 determines that at least one but not all of the first comparison results in the i$^{th}$ detecting voltage scan cycle indicates that the voltage level of the detecting voltage Vdet is less than or equal to the corresponding sampled amplitude (e.g., the sampled amplitudes SAM and SAP) (e.g., at least one but not all of the first comparison results is the logic value 0), the core circuit 330 determines that the maximum value of the input signal sampled amplitudes is found. It should be noted that the embodiment of the disclosure is not used to find a real voltage value of the maximum value of the sampled amplitudes, but to regard the current detection voltage Vdet as the approximation of the maximum value of the sampled amplitudes. The core circuit 330 takes the corresponding voltage coefficient of the voltage level of the detecting voltage Vdet as a first boundary voltage coefficient Cmax.

With reference to FIG. 4C, once the core circuit 330 determines that the first condition has already occurred, the core circuit 330 starts to determine whether the second condition occurred. Because the detecting voltage Vdet is continuously decreased according to the voltage coefficient, the voltage level of the detecting voltage Vdet in an (i+1)$^{th}$ detecting voltage scan cycle is decreased by one step as compared to the detecting voltage Vdet in the i$^{th}$ detecting voltage scan cycle. The detecting voltage Vdet may be adjusted to be as low as the minimum value of the permissible voltage range, such as a voltage level closest to the threshold voltage Vth. Starting from the (i+1)$^{th}$ detecting voltage scan cycle, the core circuit 330 can determine whether the first comparison results with the fixed quantity obtained from each of the subsequent detecting voltage scan cycles satisfy the second condition. The second condition is only a part but not all of a plurality of first comparison results in a previous ((j−1)$^{th}$) detecting voltage scan cycle indicating that the voltage level of the detecting voltage Vdet is less than or equal to the corresponding input signal sampled amplitude (e.g., only a part but not all of the first comparison results is the logic value 0), being changed to all of the first comparison results in a current (j$^{th}$) detecting voltage scan cycle indicating that the voltage level of the detecting voltage Vdet is less than or equal to the corresponding sampled amplitude (e.g., all of the first comparison results are the logic value 0).

With reference to FIG. 4C, after operating with different detecting voltage levels, when the core circuit 330 determines that all of a plurality of first comparison results in the j$^{th}$ detecting voltage scan cycle indicate that the voltage level of the detecting voltage Vdet is less than or equal to the corresponding sampled amplitude (the smallest sampled amplitudes in FIG. 4C are SA1 and SAN), the core circuit 330 determines that the minimum value of the input signal sampled amplitudes is found. It should be noted that the embodiment of the disclosure is not used to find the real voltage value of the minimum value of the sampled amplitudes, but to regard the current detection voltage Vdet as the approximation of the minimum value of the sampled amplitudes. The core circuit 330 takes the corresponding voltage coefficient of the voltage level of the detecting voltage Vdet as a second boundary voltage coefficient Cmin.

The reference voltage generator 300 can generate an average voltage coefficient Cavg by calculating for an average value of the first boundary voltage coefficient Cmax and the second boundary voltage coefficient Cmin, and perform a digital-to-analog conversion action on the average voltage coefficient Cavg to generate the reference voltage d[t] required by the SSLMS algorithm.

Figure 5:
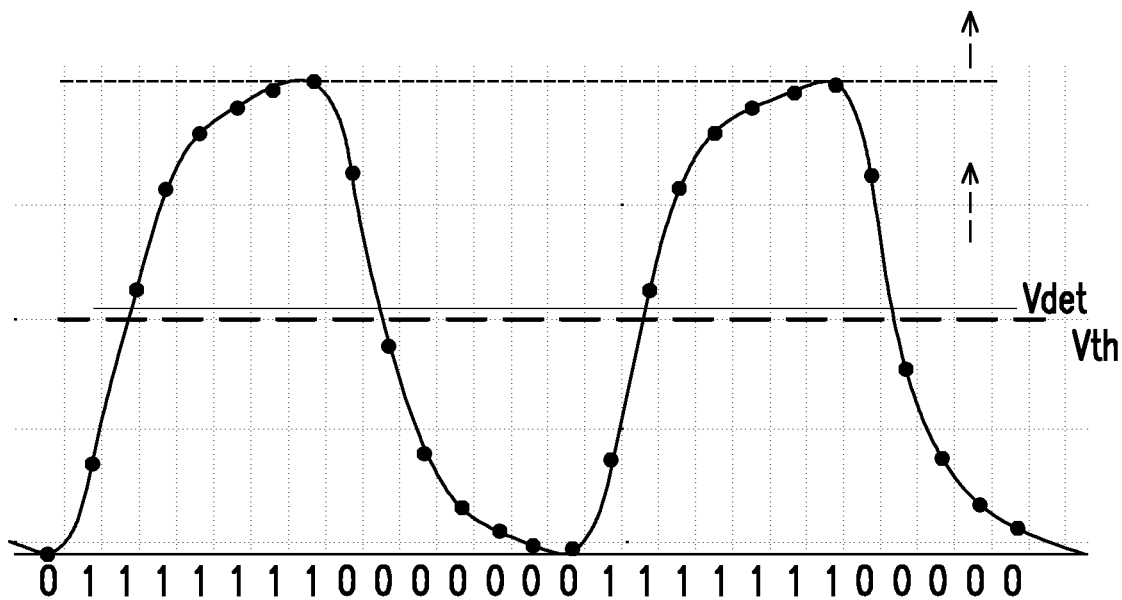
FIG. 5 is a schematic diagram illustrating another implementation of the actions in the detecting voltage scan cycle of the reference voltage generator according to an embodiment of the disclosure.

Next, referring to FIG. 3 and FIG. 5 together, FIG. 5 is a schematic diagram illustrating another implementation of the actions in the detecting voltage scan cycle of the reference voltage generator according to an embodiment of the disclosure. Compared to the implementation in FIG. 4A to FIG. 4C, in FIG. 5, the reference voltage generator 300 performs the detecting voltage scan cycles by gradually increasing the voltage level of the detecting voltage Vdet. In other words, the initial voltage level of the detecting voltage Vdet may be set as the minimum value or the approximation of the minimum value within the permissible voltage range, and to be gradually adjusted/increased. In this embodiment, the first condition is all of a plurality of the first comparison results in a previous $((i-1)^{th})$ detecting voltage scan cycle indicating that the voltage level of the detecting voltage Vdet is less than the corresponding input signal sampled amplitude being changed to at least one of the first comparison results in a current $(i^{th})$ detecting voltage scan cycle indicating that the voltage level of the detecting voltage Vdet is greater than or equal to the corresponding sampled amplitude. When the core circuit 330 determines that the first condition occurred, it means that the minimum value of the input signal sampled amplitudes is found. In this case, the core circuit 330 takes the corresponding voltage coefficient of the voltage level of the current detecting voltage Vdet as the first boundary voltage coefficient, and determines whether the second condition occurred in the subsequent detecting voltage scan cycles. In this embodiment, the second condition is that a part but not all of a plurality of first comparison results in a previous $((j-1)^{th})$ detecting voltage scan cycle indicating that the voltage level of the detecting voltage Vdet is greater than or equal to the corresponding input signal sampled amplitude, being changed to all of the first comparison results in a current $(j^{th})$ detecting voltage scan cycle indicating that the voltage level of the detecting voltage Vdet is greater than or equal to the corresponding sampled amplitude. When the core circuit 330 determines that the second condition occurred, it means that the maximum value of the input signal sampled amplitudes is found. In this case, the core circuit 330 takes the corresponding voltage coefficient of the voltage level of the current detecting voltage Vdet as the second boundary voltage coefficient.

Figure 6A:
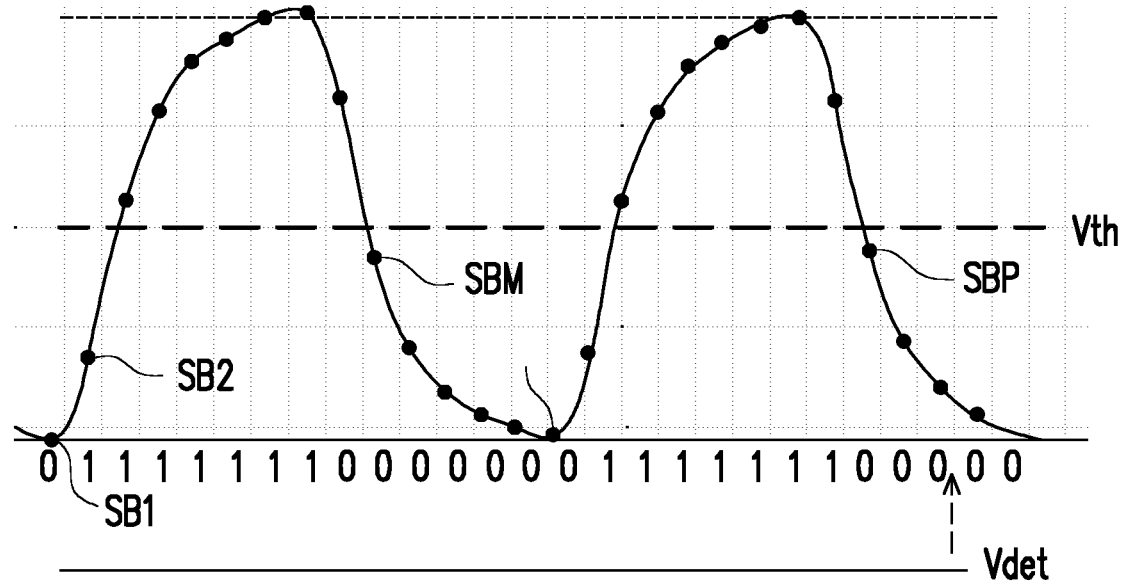
FIG. 6A to FIG. 6C are schematic diagrams illustrating another implementation of the actions in the detecting voltage scan cycle of the reference voltage generator in an embodiment of the disclosure.
Figure 6B:
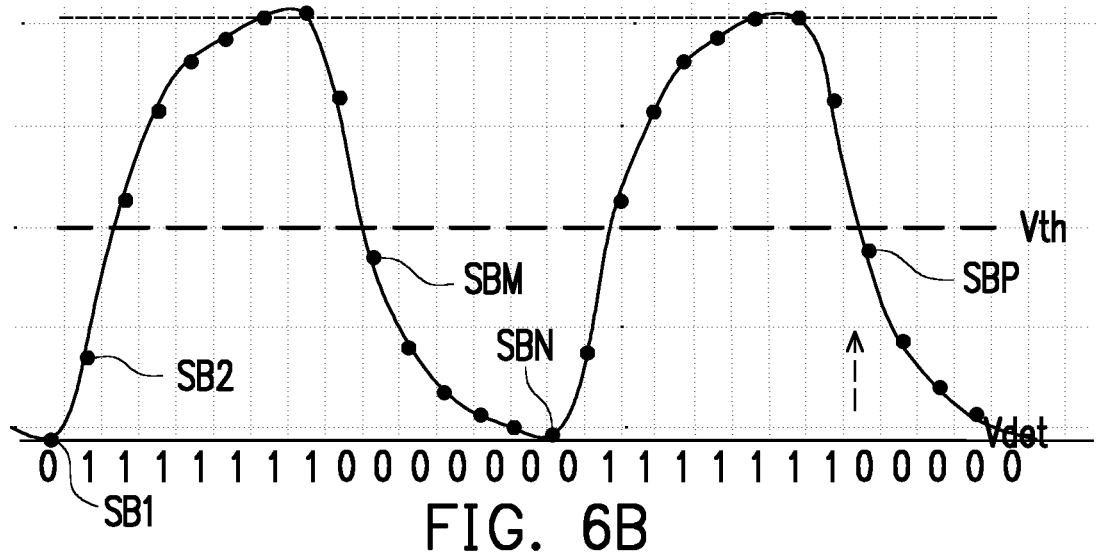
Figure 6C:
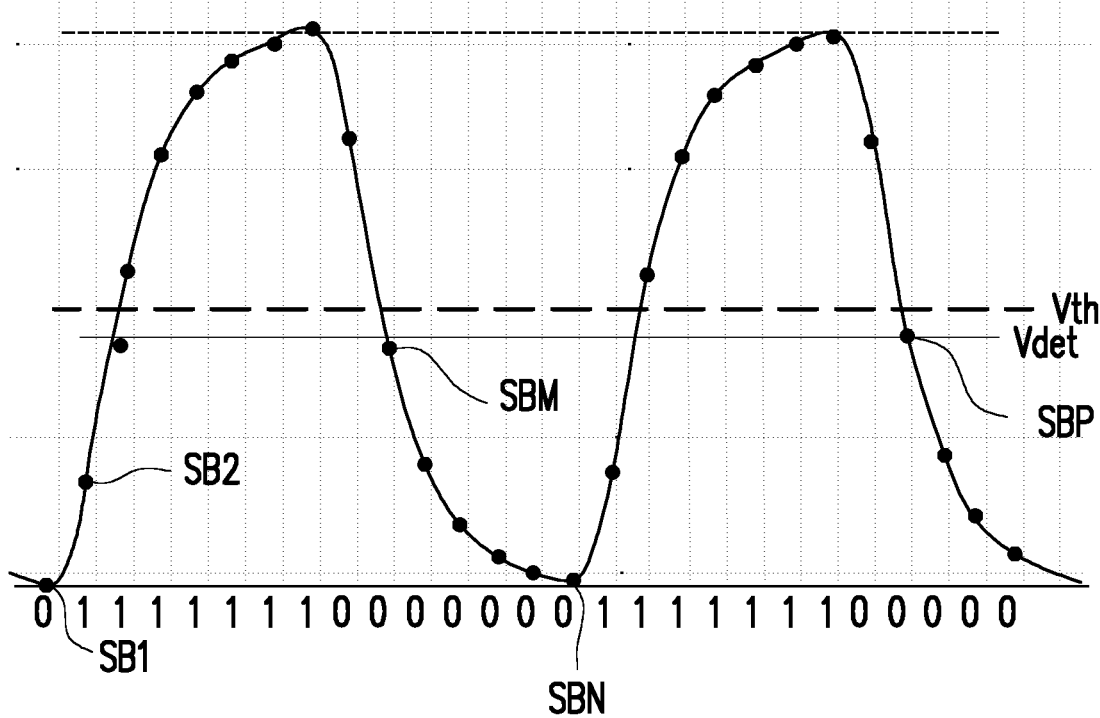

Next, referring to FIG. 3 and FIG. 6A to FIG. 6C together, FIG. 6A to FIG. 6C are schematic diagrams illustrating a detecting voltage scan cycle during which the reference voltage generator 300 is used to generate the negative reference voltage −d[t]. A circuit operating method for generating the negative reference voltage −d[t] by the detecting voltage provider 310, the comparator 320 and the core circuit 330 in the reference voltage generator 300 is identical to the circuit operating method for generating the positive reference voltage +d[t] described above, which is not repeated hereinafter. The difference is that, when the negative reference voltage −d[t] is to be generated, the permissible voltage range of the detecting voltage Vdet is below the threshold voltage Vth, which is different from the permissible range of the detecting voltage for generating the positive reference voltage −d[t] (above the threshold voltage Vth). As shown by FIG. 6A, the detecting voltage provider 310 can initially output the detecting voltage Vdet with a relatively low voltage level, and perform the detecting voltage scan cycles by gradually increasing the voltage level of the detecting voltage Vdet. In this way, as shown by FIG. 6B, the core circuit 330 would first use the first condition to find the minimum value of the input signal sampled amplitudes corresponding to the received bit 0 (e.g., SB1 or SBN), and take the corresponding voltage coefficient of the current detecting voltage Vdet as a first boundary voltage coefficient Cmin. Only then, the core circuit 330 uses the second condition to find the maximum value of the input signal sampled amplitudes corresponding to the received bit 0. Next, as shown by FIG. 6C, when the core circuit 330 confirms that the maximum value of the sampled amplitudes is found (SBM or SBP), the core circuit 330 takes the corresponding voltage coefficient of the current detecting voltage Vdet as a second boundary voltage coefficient Cmax.

In the embodiment of FIG. 6A to FIG. 6C, the first condition used by the core circuit 330 is all of a plurality of first comparison results in a previous $((i-1)^{th})$ detecting voltage scan cycle indicating that the voltage level of the detecting voltage Vdet is less than the corresponding sampled amplitude, being changed to at least one but not all of the first comparison results in a current $(i^{th})$ detecting voltage scan cycle indicating that the voltage level of the detecting voltage Vdet is greater than or equal to the corresponding sampled amplitude. In the embodiment of FIG. 6A to FIG. 6C, the second condition used by the core circuit 330 is that a part but not all of a plurality of first comparison results in a previous $((j-1)^{th})$ detecting voltage scan cycle indicating that the voltage level of the detecting voltage Vdet is greater than or equal to the corresponding sampled amplitude, being changed to all of the first comparison results in a current $(j^{th})$ detecting voltage scan cycle indicating that the voltage level of the detecting voltage Vdet is greater than or equal to the corresponding sampled amplitude.

In another embodiment, when the reference voltage generator 300 is used to generate the negative reference voltage −d[t], the detecting voltage provider 310 can also initially output the detecting voltage Vdet with the relatively high voltage level (close to or equal to the threshold voltage Vth) and the core circuit 330 can perform a plurality of detecting voltage scan cycles by gradually decreasing the voltage level of the detecting voltage Vdet. Accordingly, the maximum value and the minimum value of the input signal sampled amplitudes corresponding to the received bit 0 may also be found in sequence so as to obtain the first boundary voltage coefficient and the second boundary voltage coefficient. In this embodiment, the first condition used by the core circuit 330 is all of a plurality of first comparison results in a previous $((i-1)^{th})$ detecting voltage scan cycle indicating that the voltage level of the detecting voltage Vdet is greater than the corresponding sampled amplitude being changed to at least one but not all of the first comparison results in a current $(i^{th})$ detecting voltage scan cycle indicating that the voltage level of the detecting voltage Vdet is less than or equal to the corresponding sampled amplitude. The second condition used by the core circuit 330 is a part but not all of a plurality of first comparison results in a previous ((j−1)$^{th}$) detecting voltage scan cycle indicating that the voltage level of the detecting voltage Vdet is less than or equal to the corresponding sampled amplitude, being changed to all of the first comparison results in a current (j$^{th}$) detecting voltage scan cycle indicating that the voltage level of the detecting voltage Vdet is less than or equal to the corresponding sampled amplitude.

When a channel distortion is not large or there are other ways to reduce the channel distortion, the bits actually transmitted by the signal transmitter are identical to the bits actually received by the signal receiver. In this case, the reference voltage generator 300 can generate a correct reference voltage simply by using the process for generating the reference voltage provided in FIG. 4A to FIG. 6C. However, when the channel distortion is larger or cannot be reduced, it is likely that the bits actually transmitted by the transmitter are bit 1 but the received signal are actually bit 0. Under this condition, if the reference voltage generator 300 uses only the process for generating the reference voltage described in FIG. 4A to FIG. 6C, the real minimum value of the input signal sampled amplitudes that should be determined as the received bit 1 cannot be correctly found. For instance, the minimum value of the input signal sampled amplitudes y[t] found by the core circuit 330 according to the second condition in FIG. 4C may not be the real minimum value of the sampled amplitudes y[t] corresponding to the received bit 1. Due to the large channel distortion, a real minimum value of the input signal sampled amplitudes y[t] may be lower than the threshold voltage Vth. Accordingly, the reference voltage generated by the reference voltage generator 300 may not be accurate enough. Therefore, a solution of the above issue is further described below according to an embodiment of the disclosure.

Figure 7A:
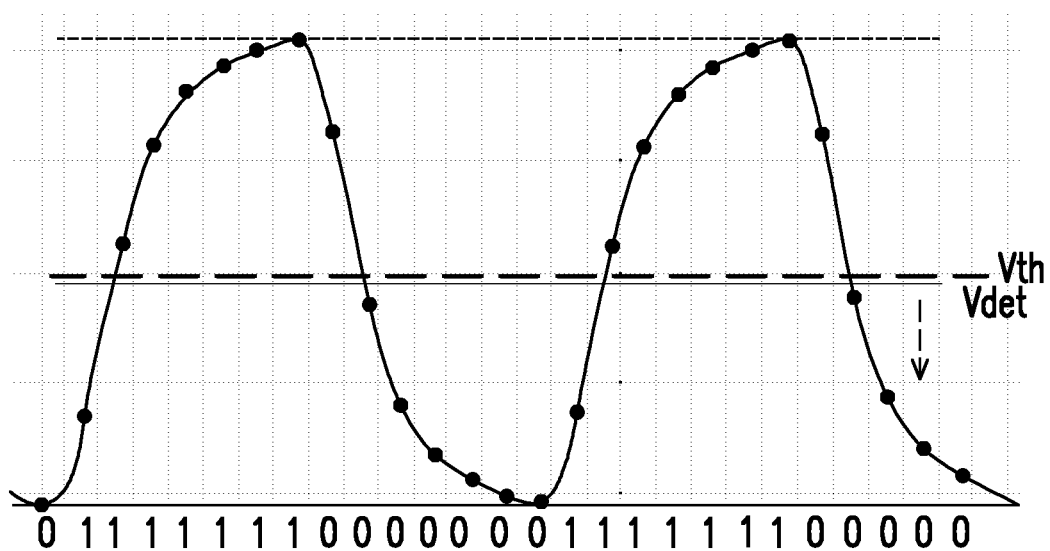
FIG. 7A to FIG. 7B are schematic diagrams illustrating another implementation of the actions in the detecting voltage scan cycle of the reference voltage generator according to an embodiment of the disclosure.
Figure 7B:
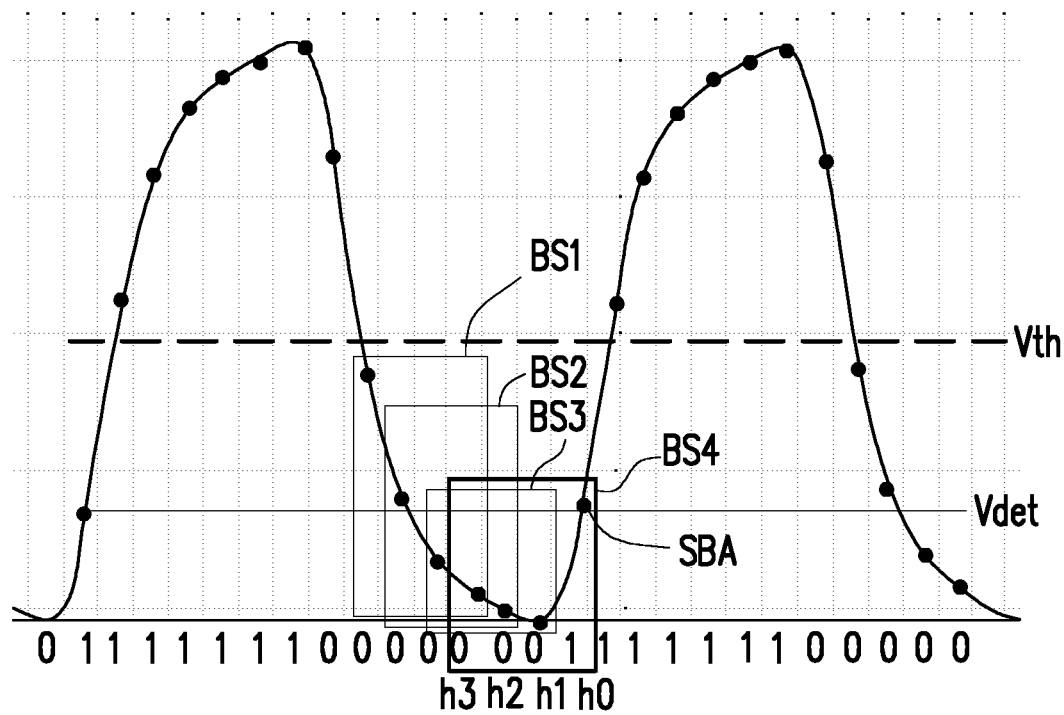
Figure 8:
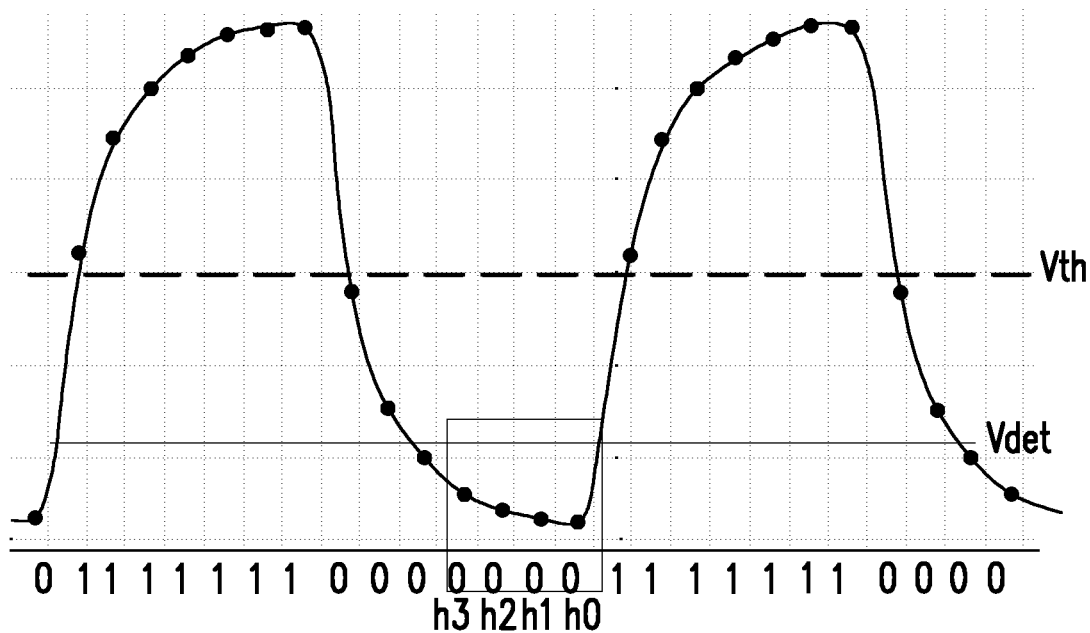
FIG. 8 is a schematic diagram illustrating another implementation of the actions in the detecting voltage scan cycle of the reference voltage generator according to an embodiment of the disclosure.

Referring to FIG. 3, FIGS. 7A to 7B and FIG. 8, herein FIGS. 7A to 7B and FIG. 8 are schematic diagrams illustrating another implementation of the actions in the detecting voltage scan cycle of the reference voltage generator according to an embodiment of the disclosure. In this embodiment, the minimum value of the input signal sampled amplitudes found in FIG. 4C is regarded as a temporary minimum value, and the second boundary voltage coefficient found is regarded as a temporary second boundary voltage coefficient. After finding the temporary second boundary voltage coefficient, the core circuit 330 would continue to perform the detecting voltage scan cycles. The detecting voltage Vdet would be decreased step by step so the real minimum value of the input signal sampled amplitudes corresponding to the received bit 1 and the real second boundary voltage coefficient may be found by a searching method illustrated in FIGS. 7A to 7B and FIG. 8. In FIG. 7A, the detecting voltage provider 310 can provide the detecting voltage Vdet with the voltage level below the threshold Vth that may be decreased step by step.

In the detecting voltage scan cycle with the detecting voltage Vdet less than the threshold voltage Vth, the core circuit 330 receives each of the comparison results output by the comparator 320 but no longer determines whether to keep or ignore each of the comparison results according to whether the corresponding current received bit is 1 or 0. In other words, the core circuit 330 does not perform the action of collecting the first comparison results with the fixed quantity. The core circuit 330 receives the received bits h0 to hm from the decision feedback equalizer, including the current received bit h0 and the previous received bits h1 to hm. Also, the core circuit 330 performs the following two actions of: (1) determining whether the comparison result corresponding to the current received bit h0 (which is called a second comparison result to be clearly distinguished from the first comparison result) satisfies a third condition, and (2) determining whether the received bits h0 to hm match (completely matched) a preconfigured bit sequence pattern. The action of determining whether the received bits h0 to hm match the preconfigured bit sequence pattern is performed by a filter in the core circuit 330. If the reference voltage to be generated by the reference voltage generator 300 is the positive reference voltage +d[t], the third condition is the second comparison result corresponding to the current received bit h0 indicating that the voltage level of the detecting voltage Vdet is less than or equal to the corresponding input signal sampled amplitude y[t]. Further, the preconfigured bit sequence pattern is a bit 0 sequence, such as four consecutive bits 0. FIG. 7B illustrates how the core circuit 330 determines for each of the received bits h0, whether sequences formed by the four consecutive bits h0 to h3 (e.g., sequences BS1 to BS4) match a preconfigured bit sequence pattern [0, 0, 0, 0].

The core circuit 330 replaces the temporary second boundary voltage coefficient by the voltage coefficient corresponding to the current detecting voltage (i.e., the real second boundary voltage coefficient) in response to two situations below being true: (1) the second comparison result corresponding to the current received bit h0 satisfies the third condition, and (2) the received bits h0 to hm match the preconfigured bit sequence pattern. This voltage coefficient is the corresponding voltage coefficient of the detecting voltage Vdet that should be the real minimum value of the input signal sampled amplitudes corresponding to the received bit 1 (but became bit 0 due to the channel distortion) as found by the core circuit 330.

With reference to FIG. 7B, because the second comparison results corresponding to each current received bit h0 in the sequences BS1 to BS3 all indicate that the voltage level of the detecting voltage Vdet is greater than the corresponding input signal sampled amplitude y[t], the third condition is not satisfied. Although all of the sequences BS1 to BS3 are the received bits [h3, h2, h1, h0]=[0, 0, 0, 0] that match the preconfigured bit sequence pattern, the core circuit 330 would not replace said temporary second boundary voltage coefficient by the current detecting voltage Vdet since the two situations described above are not both true. Please once again refer to FIG. 7B, in the sequence BS4, because the second comparison result corresponding to the current received bit h0 indicates that the voltage level of the detecting voltage Vdet is less than or equal to the corresponding to the input signal sampled amplitude y[t], the third condition is satisfied. Further, the sequence BS4 is also [h3, h2, h1, h0]=[0, 0, 0, 0] which matches the preconfigured bit sequence pattern. Since the above two situations are both true, the core circuit 330 would replace the said temporary second boundary voltage coefficient by the current detecting voltage Vdet. The reference voltage generator 300 can generate the reference voltage +d[t] to be used in the decision feedback equalizer according to the first boundary voltage coefficient and the replaced second boundary voltage coefficient.

When the core circuit 330 performs said two determining actions for the comparison results with the fixed quantity but still unable to find the real minimum value of the input signal sampled amplitudes, the core circuit 330 decreases the detecting voltage Vdet by one step and continues to perform said two determining actions in the next detecting voltage scan cycle. If the detecting voltage Vdet has been decreased to a minimum value and yet the core circuit 330 is still unable to find the real minimum value of the input signal sampled amplitudes below the threshold voltage Vth, it may mean that the effect of the channel distortion on the input signal is not large so it is not required to replace the second boundary voltage coefficient previously found. With reference to FIG. 8, FIG. 8 illustrates the situation where although the situation which received bit sequence match the preconfigured bit sequence pattern has occurred, but the second comparison result corresponding to the current received bit h0 does not satisfy the third condition such that it is not required to replace the second boundary voltage coefficient previously found. When the core circuit 330 generates the reference voltage according to FIGS. 4A to 4C and FIGS. 7A to 7B, the timings for adjusting the voltage coefficient by the core circuit 330 includes: the core circuit 330 generates the voltage coefficient corresponding to a second voltage level (different from the voltage level of the detecting voltage Vdet currently used) to be output to the detecting voltage provider 310 when (1) none or merely one of conditions among the first condition and the second condition occurred; or when both the first condition and the second condition occurred but at least one of following situations is not true; (2) a second comparison result corresponding to the current received bit h0 satisfies a third condition, and (3) a plurality of received bits h0 to hm match a preconfigured bit sequence pattern.

In another embodiment, when the reference voltage to be generated is the negative reference voltage −d[t], the preconfigured bit sequence pattern may be set to a bit 1 sequence such as [1, 1, 1, 1], and the third condition is the second comparison result corresponding to the current received bit h0 indicating that the voltage level of the detecting voltage Vdet is greater than or equal to the corresponding input signal sampled amplitude.

Figure 9A:
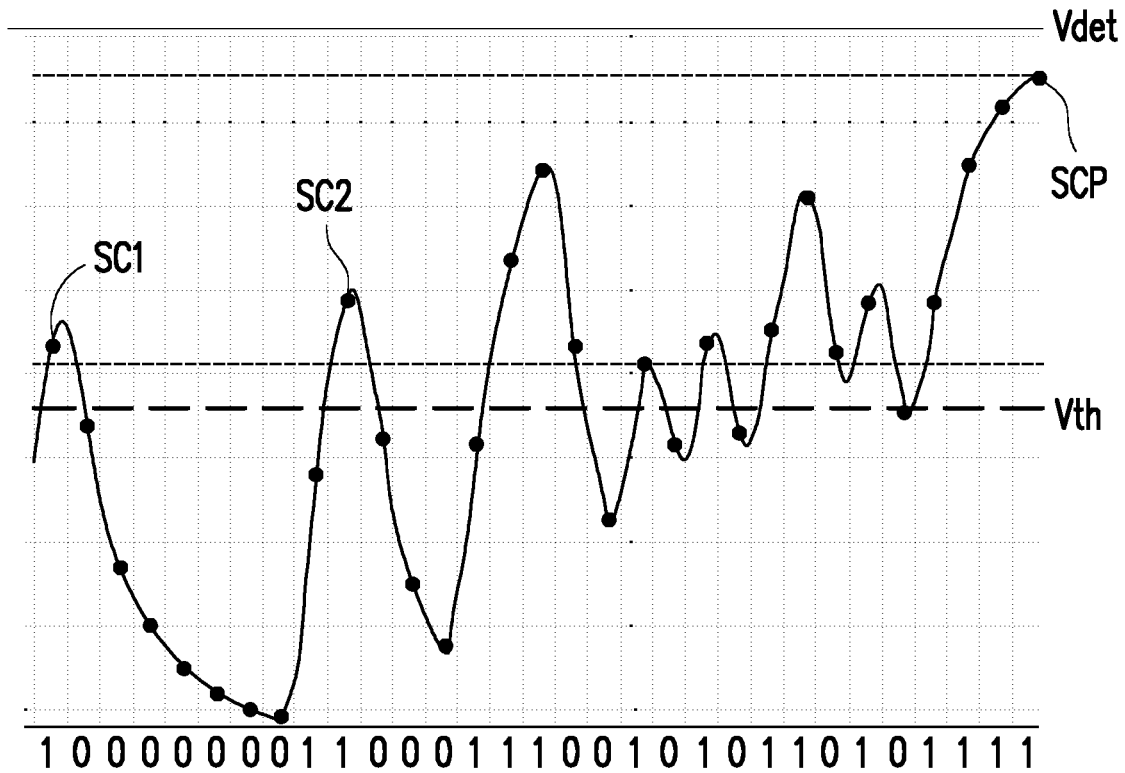
FIG. 9A to FIG. 9C are schematic diagrams illustrating another implementation of the actions in the detecting voltage scan cycle of the reference voltage generator according to an embodiment of the disclosure.
Figure 9B:
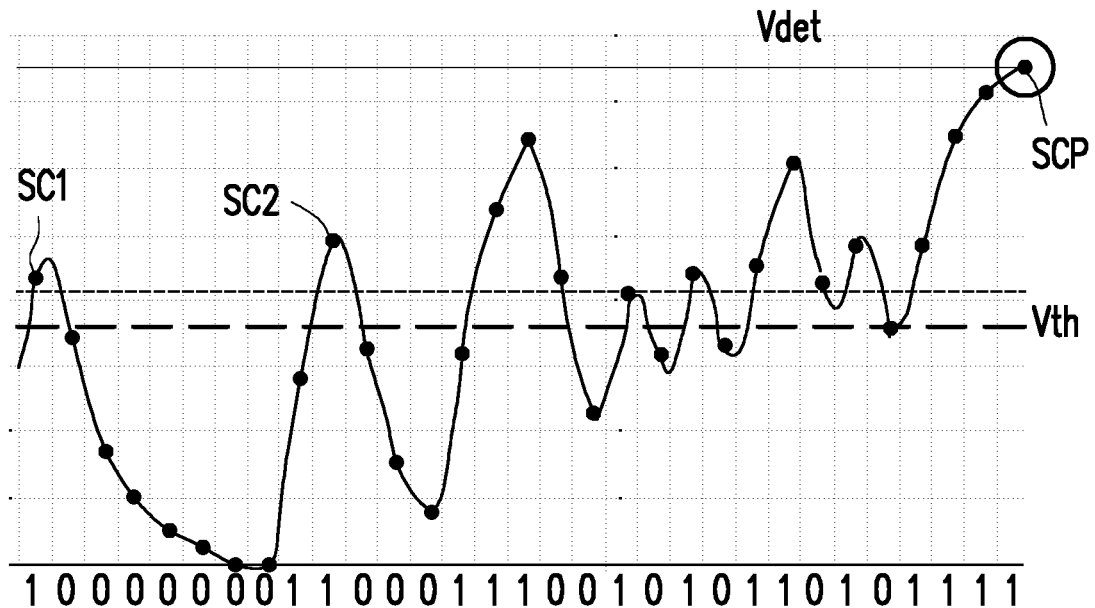
Figure 9C:
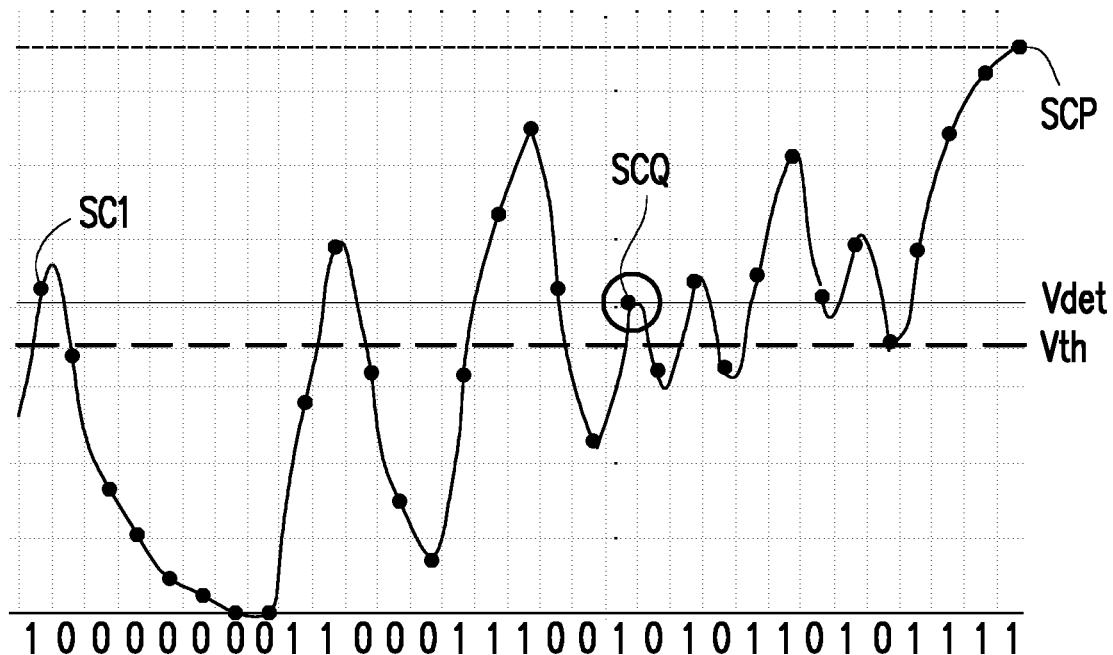

Referring to FIG. 3 and FIG. 9A to FIG. 9C, FIG. 9A to FIG. 9C are schematic diagrams illustrating another implementation of the actions in the detecting voltage scan cycle of the reference voltage generator according to an embodiment of the disclosure. In the implementation of FIG. 9A to FIG. 9C, the input signal is a pseudo random binary sequence signal. In FIG. 9A, the detecting voltage provider 310 sets the detecting voltage Vdet with a relatively high voltage, and gradually decreases the voltage level of the detecting voltage Vdet according to the adjusted voltage coefficient output by the core circuit 300. The comparator 320 compares the voltage level of the detecting voltage Vdet with a plurality of sampled amplitudes of the input signal y(t) to generate a plurality of comparison results. Next, the core circuit 330 collects a plurality of first comparison results corresponding to the current received bit 1 from the comparison results. The corresponding sampled amplitudes of the first comparison results are SC1 to SCP above the threshold voltage Vth. In FIG. 9B, according to the first condition in the foregoing embodiment of FIGS. 4A to 4C, the reference voltage generator 300 can find the maximum value of the sampled amplitude of the input signal y(t) (corresponding to the sampled amplitude SCP), and set the voltage coefficient corresponding to the voltage level of the detecting voltage Vdet as the first boundary voltage coefficient.

In FIG. 9C, the detecting voltage provider 310 continues to gradually decrease the voltage level of the detecting voltage Vdet, and compares the voltage level of the detecting voltage Vdet with the sampled amplitudes SC1 to SCP of the input signal y(t) in each of the detecting voltage scan cycles. According to the second condition in the foregoing embodiment, the reference voltage generator 300 can obtain a temporary minimum value of the sampled amplitudes of the input signal y(t) (corresponding to a sampled amplitudes SCQ), and set the voltage coefficient corresponding to the voltage level of the detecting voltage Vdet as the second boundary voltage coefficient.

The core circuit 330 can calculate an average value of the first boundary voltage coefficient and the second boundary voltage coefficient, and generate the reference voltage d[t] according to the average value.

The implementation of FIG. 9A to FIG. 9C is similar to the implementation of FIG. 4A to FIG. 4C, in which the reference voltage generator 300 performs the scan cycles by gradually decreasing the voltage level of the detecting voltage Vdet. Naturally, the reference voltage generator 300 may also perform the scan cycles by gradually increasing the voltage level of the detecting voltage Vdet. The relevant implementation may refer to related description in the implementation of FIG. 5, which is not repeated hereinafter.

Figure 10:
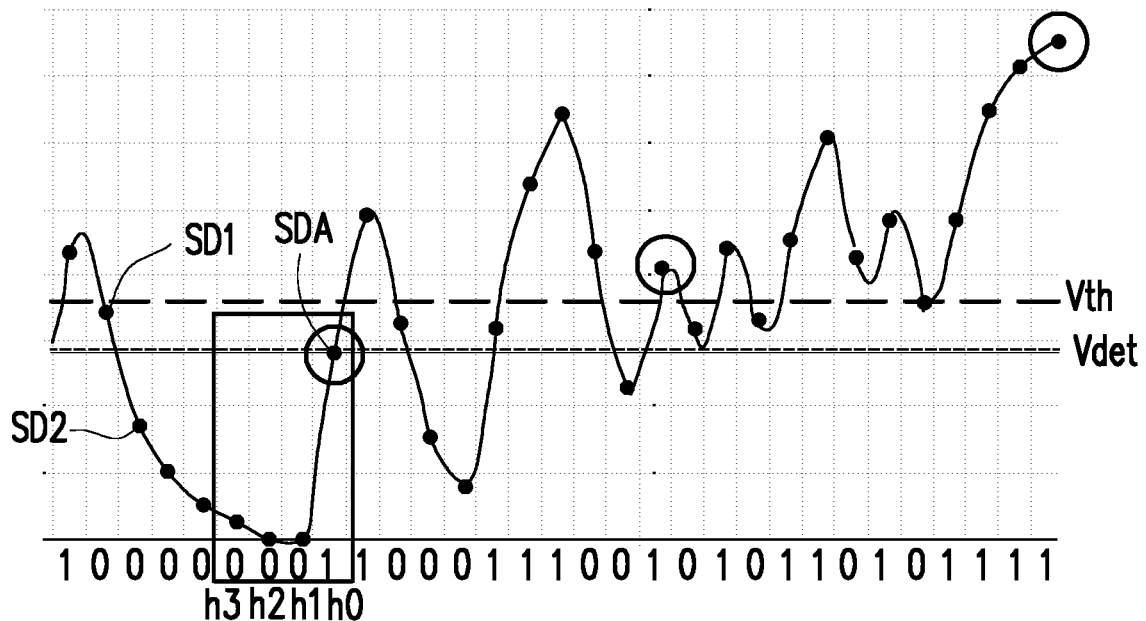
FIG. 10 to FIG. 12 are schematic diagrams respectively illustrating different implementations of the actions in the detecting voltage scan cycle of the reference voltage generator according to an embodiment of the disclosure.
Figure 11:
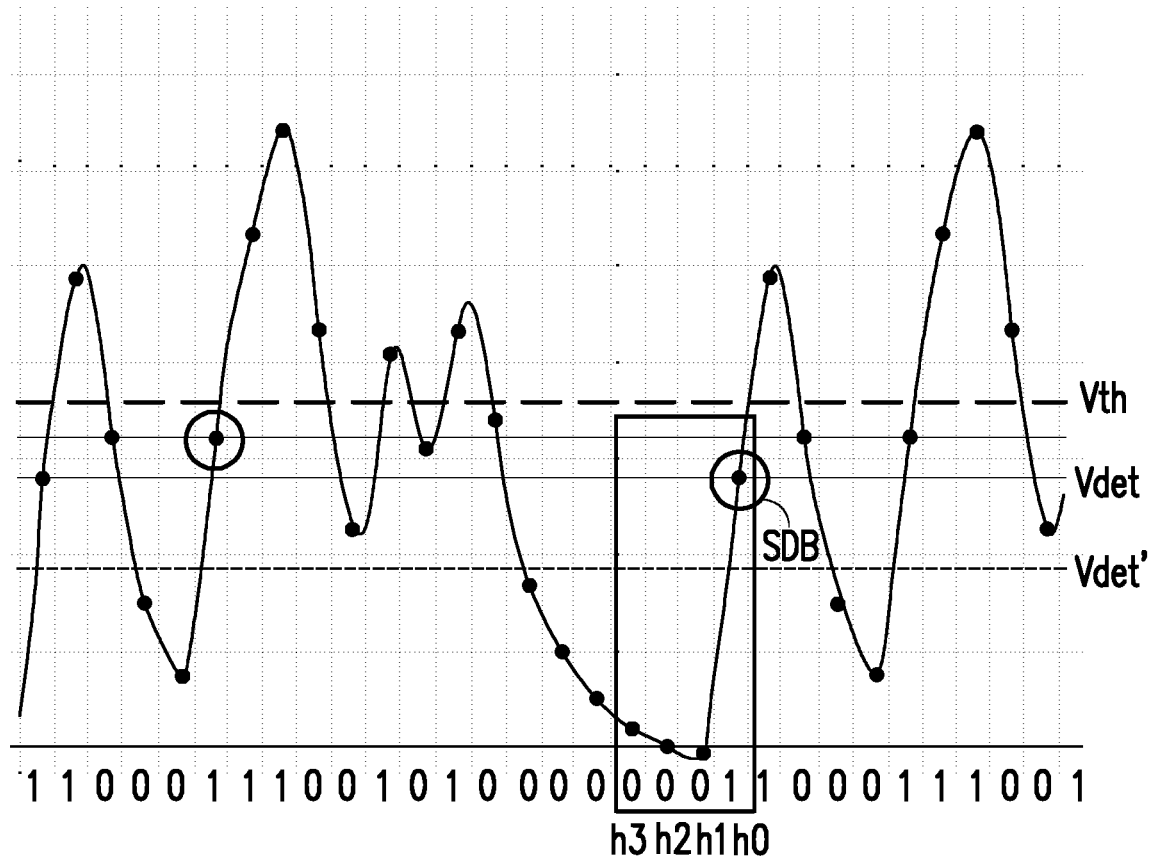
Figure 12:
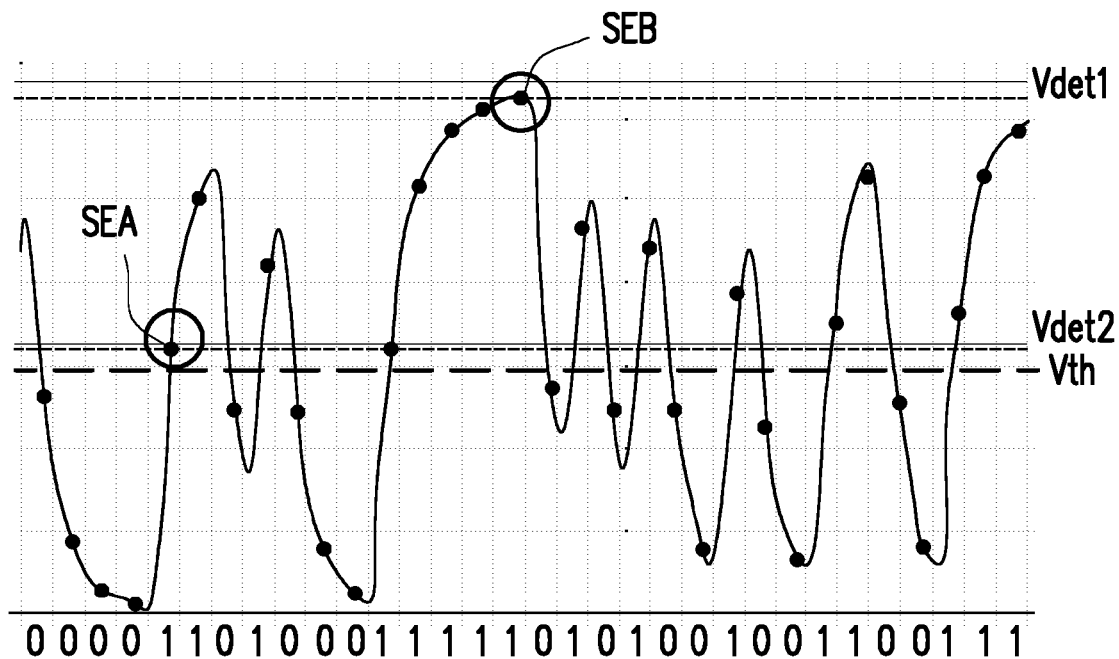

With reference to FIG. 3, FIG. 10 to FIG. 12, herein FIG. 10 to FIG. 12 are schematic diagrams respectively illustrating different implementations of the actions in the detecting voltage scan cycle of the reference voltage generator according to an embodiment of the disclosure. In FIG. 10, the reference voltage generator 300 performs a comparison action on a plurality of sampled amplitudes (e.g., sampled amplitudes SD1, SD2, . . . , SDA) of the input signal y(t) below the threshold voltage Vth. The detecting voltage provider 310 can initially set the voltage level of the detecting voltage Vdet to be equal to the threshold voltage Vth, and perform a plurality of detecting voltage scan cycles by gradually deceasing the voltage level of the detecting voltage Vth. In this embodiment, the core circuit 330 includes a filter, and determines whether a received bit sequence formed by the received h0 to hm matches a preconfigured bit sequence pattern. Further, the core circuit 330 determines whether a second comparison result corresponding to the current received bit h0 satisfy the third condition. When said two situations are both true, the core circuit 330 may consider that the real minimum value of the sampled amplitudes of the input signal y(t) (corresponding to the sampled amplitude SDA) has been found, and obtain the voltage coefficient corresponding to the actual minimum detecting voltage Vdet, so as to generate the second boundary voltage coefficient for updating.

The core circuit 330 uses the second boundary voltage coefficient for updating to replace the temporary second boundary voltage coefficient, and obtains the positive reference voltage +d[t] through a reference voltage coefficient generated by calculating an average value of the first boundary voltage coefficient and the second boundary voltage coefficient.

In the detecting voltage scan cycle described in FIG. 11, if a sampled amplitude SDB is regarded as the real minimum value of the sampled amplitudes of the input signal y(t), actions of the scan cycles for the detecting voltage Vdet may still be continuously performed until a potential of the detecting voltage Vdet drops to a preset potential Vdet', so as to search for whether there is the real minimum value of the sampled amplitudes of the input signal y(t) with an even lower voltage level.

In FIG. 12, through the detecting voltage scan cycles, the maximum value of the sampled amplitudes of the input signal y(t) (corresponding to a sampled amplitude SEB) may be obtained when the voltage level is at Vdet1, and the minimum value of the sampled amplitudes of the input signal y(t) (corresponding to a sampled amplitude SEA) may be found when the voltage level is at Vdet2. Also, in the scan cycle with the detecting voltage below the threshold voltage Vth, the situations where the third condition is satisfied and the received bit sequence matches the preconfigured bit sequence pattern do not happen simultaneously. Therefore, according to the first boundary voltage coefficient and the second boundary voltage coefficient respectively corresponding to the voltage level Vdet1 and the voltage level Vdet2, the core circuit 330 can calculate an average value of the first boundary voltage coefficient and the second boundary voltage coefficient to be used as the reference voltage coefficient, and perform a digital-to-analog voltage conversion on the reference voltage coefficient to generate the reference voltage d[t].

The method of calculating the average value of the first boundary voltage coefficient and the second boundary voltage coefficient to be used as the reference voltage coefficient is only one of the embodiments rather than a limitation in the disclosure. In other embodiments of the disclosure, the core circuit 330 can obtain the reference voltage coefficient by calculating the first boundary voltage coefficient and the second boundary voltage coefficient given a different weight.

Figure 13:
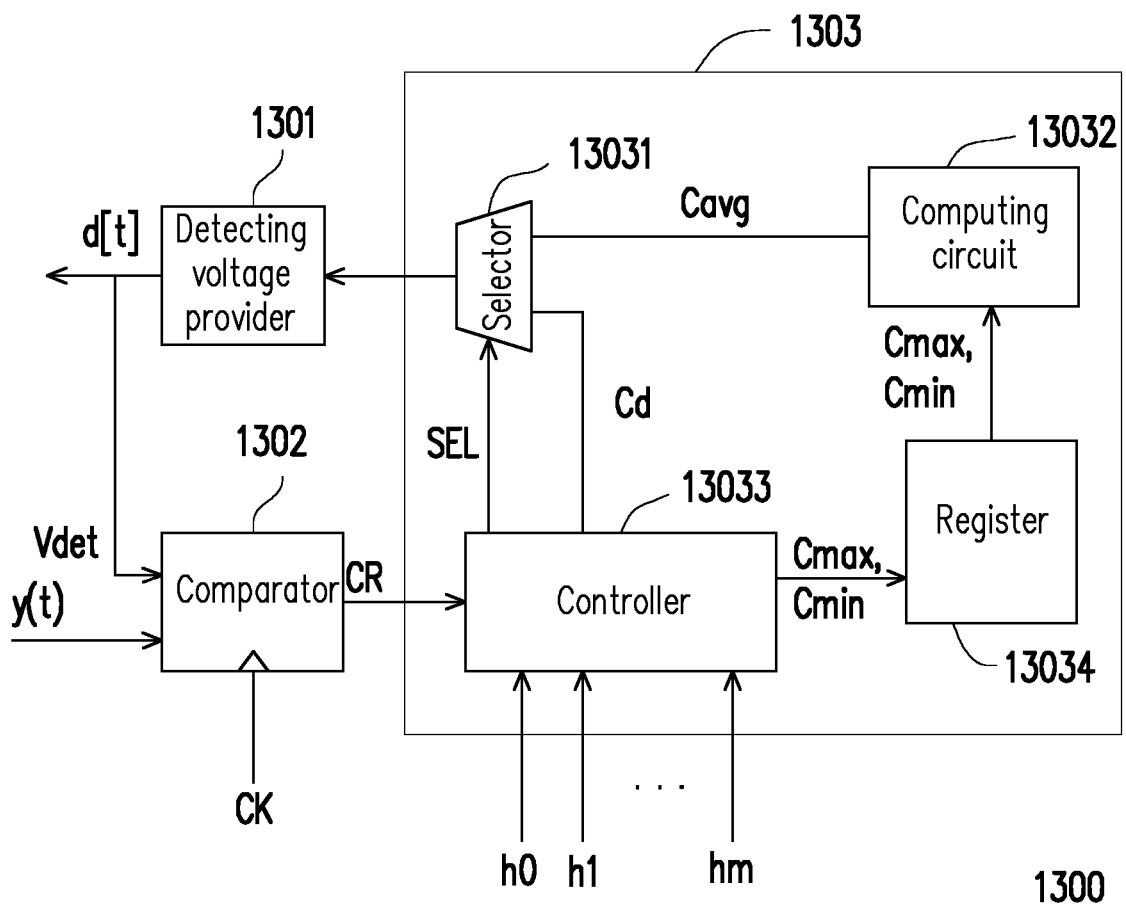
FIG. 13 is a schematic diagram illustrating an implementation of the reference voltage generator according to an embodiment of the disclosure.

With reference to FIG. 13, FIG. 13 is a schematic diagram illustrating an implementation of the reference voltage generator according to an embodiment of the disclosure. The reference voltage generator 1300 is a foreground reference voltage generator that provides a reference voltage d[t] to an equalizer. The foreground reference voltage generator means that the reference voltage is generated in advance, instead of being generated instantly according to the received input signal. A reference voltage generator 1300 includes a detecting voltage provider 1301, a comparator 1302, and a core circuit 1303. The core circuit 1303 includes a selector 13031, a computing circuit 13032, a controller 13033 and a register 13034.

The detecting voltage provider 1301 adjusts and generates the detecting voltage Vdet according to the voltage coefficient. In the embodiment of the disclosure, the detecting voltage provider 1301 may be a digital-to-analog converter. The comparator 1302 receives the input signal y(t) and the detecting voltage Vdet. Based on a clock signal CK, the comparator 1302 samples the input signal y(t) to obtain a plurality of sampled amplitudes and compare the sampled amplitudes respectively with the voltage level of the detecting voltage Vdet to generate a plurality of comparison results CR.

In the core circuit 1303, the controller 13033 receives the comparison results CR, a current received bit h0 and previous received bits h1 to hm. The controller 13033 collects a plurality of first comparison results associated with the current received bit h0 of a preset value from the comparison results CR; generate a first boundary voltage coefficient Cmax and a second boundary voltage coefficient Cmin; generate a voltage coefficient Cd corresponding to the voltage level of the detecting voltage Vdet corresponding to the next detecting voltage scan cycle to the detecting voltage provider 1301 and generate a selecting signal SEL to the selector 13031. The register 13034 is configured to temporarily store the first boundary voltage coefficient Cmax and the second boundary voltage coefficient Cmin. The computing circuit 13032 reads the first boundary voltage coefficient Cmax and the second boundary voltage coefficient Cmin form the register 13034 and operates an arithmetical operation on the first boundary voltage coefficient Cmax and the second boundary voltage coefficient Cmin to generate a reference voltage coefficient Cavg. The selector 13031 receives the reference voltage coefficient Cavg and the voltage coefficient Cd and outputs the reference voltage coefficient Cavg or the voltage coefficient Cd according to the selection signal SEL. Here, before the first boundary voltage coefficient Cmax and the second boundary voltage coefficient Cmin are obtained, the selector 13031 outputs the voltage coefficient Cd and makes the detecting voltage provider 1301 gradually adjust the voltage level of the detecting voltage Vdet for the next detecting voltage scan cycle. After all the detecting voltage scan cycles are completed and the reference voltage coefficient Cavg is generated, the selector 13031 outputs the reference voltage coefficient Cavg and the detecting voltage provider 1301 generates the reference voltage d[t] according to the reference voltage coefficient Cavg.

Figure 14:
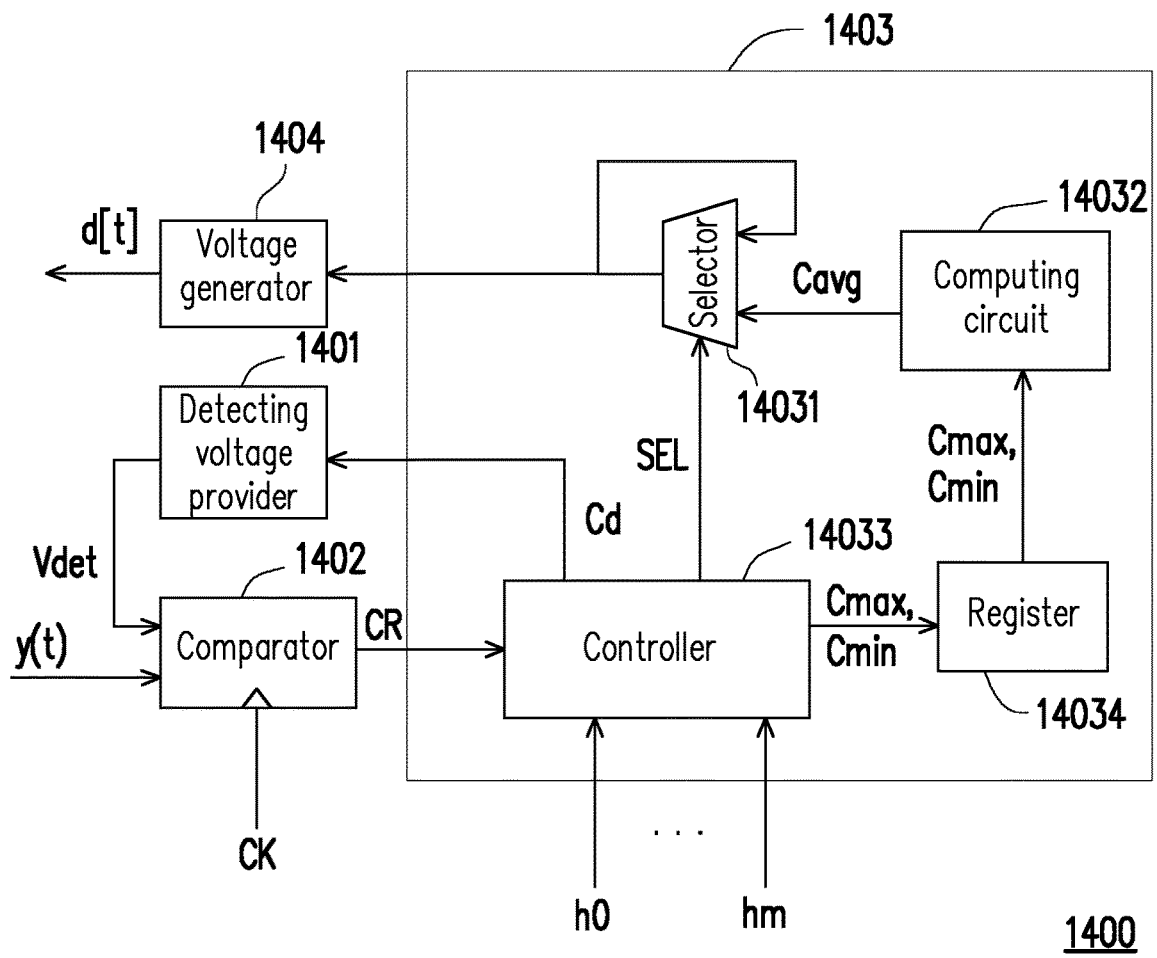
FIG. 14 is a schematic diagram illustrating another implementation of the reference voltage generator according to an embodiment of the disclosure.

With reference to FIG. 14, FIG. 14 is a schematic diagram illustrating another implementation of the reference voltage generator according to an embodiment of the disclosure. A reference voltage generator 1400 is a background reference voltage generator that provides a reference voltage d[t] to an equalizer. The background reference voltage generator means that the reference voltage is generated instantly according to the received input signal. The reference voltage generator 1400 includes a detecting voltage provider 1401, a comparator 1402, a core circuit 1403 and a voltage generator 1404. The core circuit 1403 includes a selector 14031, a computing circuit 14032, a controller 14033 and a register 14034. Unlike the reference voltage generator 1300, the reference voltage d[t] of this embodiment is generated by the voltage generator 1404 which is independent from the detecting voltage provider 1401. Also, in this embodiment, an output terminal of the selector 14301 feedbacks to one of input terminal of its own, and another input terminal of the selector 14301 receives a reference voltage coefficient Cavg. The selector 14301 can choose to output the reference voltage coefficient Cavg to the voltage generator 1404 or remain its output unchanged according to a selecting signal SEL. The voltage generator 1404 may be a digital-to-analog converter.

Figure 15:
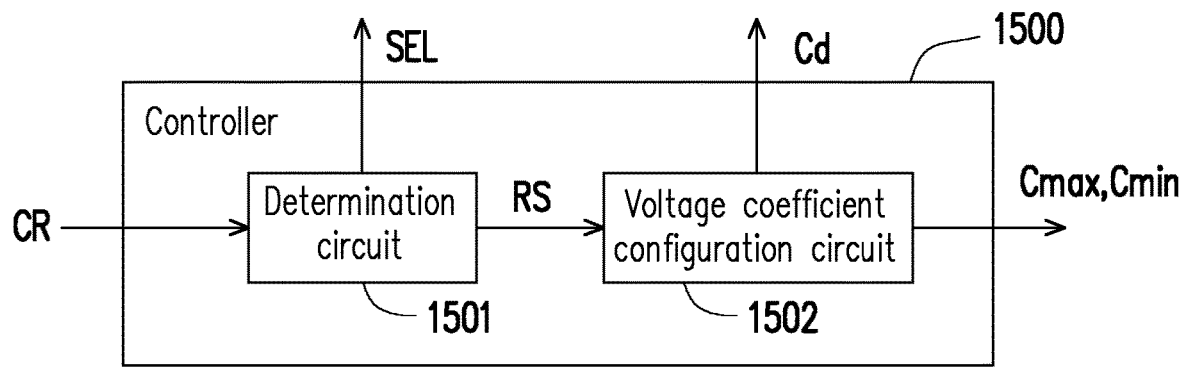
FIG. 15 is a schematic diagram illustrating an implementation of the controller according to an embodiment of the disclosure.

With reference to FIG. 15, FIG. 15 is a schematic diagram illustrating an implementation of the controller according to an embodiment of the disclosure. A controller 1500 includes a determination circuit 1501 and a voltage coefficient configuration circuit 1502. The determination circuit 1501 is configured to: collect a plurality of first comparison results associated with a current received bit of a preset value from a plurality of comparison results CR; determine whether the first comparison results satisfy a preconfigured condition to generate a resultant signal RS, where the preconfigured condition is the first condition or the second condition in the foregoing embodiments; after a first boundary voltage coefficient Cmax and a second boundary voltage coefficient Cmin are determined, generate a selecting signal SEL to the selector. The voltage coefficient configuration circuit 1502 is configured to generate a voltage coefficient Cd corresponding to the voltage level of the detecting voltage according to the resultant signal, and take the voltage coefficient Cd as at least one of the boundary voltage coefficients. Here, the boundary voltage coefficient is the first boundary voltage coefficient Cmax or the second boundary voltage coefficient Cmin.

Figure 16:
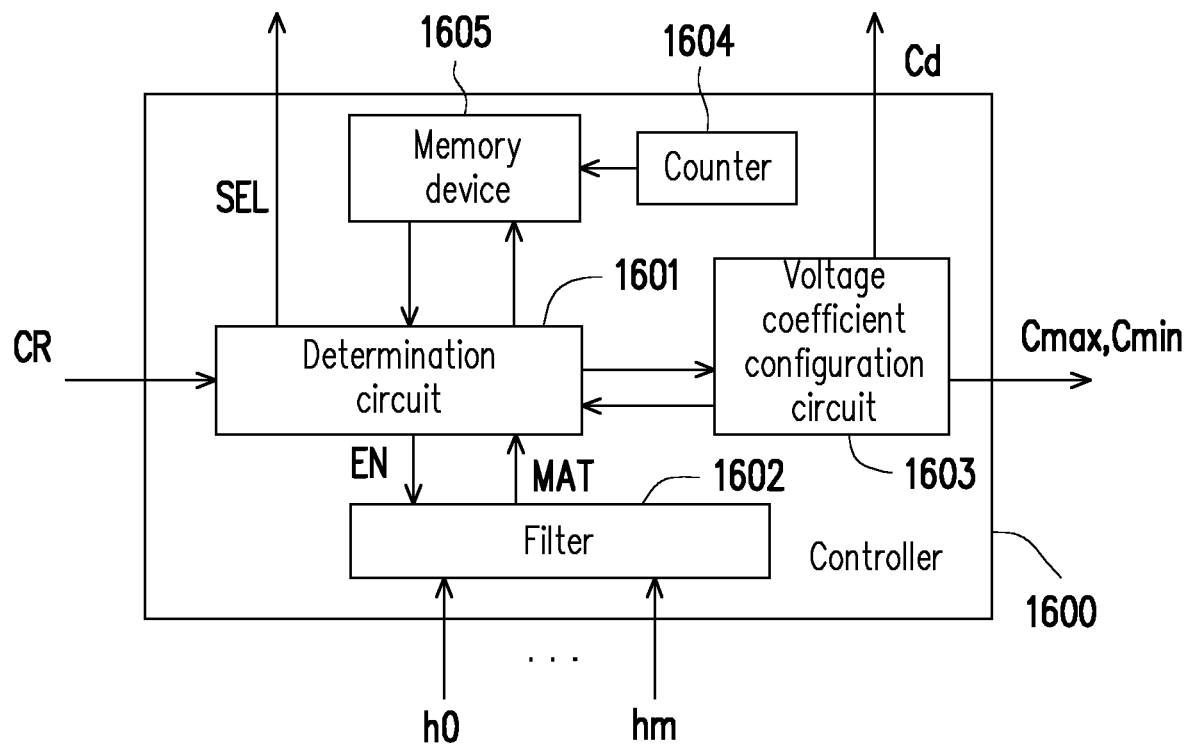
FIG. 16 is a schematic diagram illustrating another implementation of the controller according to an embodiment of the disclosure.

With reference to FIG. 16, FIG. 16 is a schematic diagram illustrating another implementation of the controller according to an embodiment of the disclosure. A controller 1600 includes a determination circuit 1601, a filter 1602, a voltage coefficient configuration circuit 1603, a counter 1604 and a memory device 1605. The filter 1602 receives a plurality of received bits h0 to hm (where h0 is the current received bit), determines whether the received bits h0 to hm match a preconfigured bit sequence pattern, and generates a match result MAT according to a matching status of the received bits h0 to hm and the preconfigured bit sequence pattern. The filter 1602 then transmits the match result MAT to the determination circuit 1601. The received bits h0 to hm are transmitted by an equalizer.

On the other hand, the determination circuit 1601 collects a plurality of first (valid) comparison results of the current received bit h0 of the associated preset value from a plurality of comparison results CR; determines whether the first comparison results satisfy a preconfigured condition to generate a first resultant signal, wherein the preconfigured condition is the first condition or the second condition in the foregoing embodiments; and determines whether the second comparison result corresponding to the current received bit h0 satisfies a third condition to generate a second resultant signal; and after a first boundary voltage coefficient Cmax and a second boundary voltage coefficient Cmin are determined, generates a selecting signal SEL to the selector.

In this embodiment, the voltage coefficient configuration circuit 1603 is configured to generate a voltage coefficient Cd corresponding to the voltage level of the detecting voltage Vdet according to the first resultant signal, the second resultant signal and the match result MAT, and take the voltage coefficient as at least one of the boundary voltage coefficients. Here, the boundary voltage coefficient is the first boundary voltage coefficient Cmax or the second boundary voltage coefficient Cmin. In detail, the voltage coefficient configuration circuit 1603 can perform a counting action on the voltage coefficient Cd. Also, in an initial state of the detecting voltage scan cycle, the voltage coefficient Cd is set to one relatively high value (e.g., 1023) so the voltage coefficient Cd is gradually decreased with different detecting voltage scan cycles. In this way, the voltage level of the detecting voltage Vdet generated according to the voltage coefficient Cd is correspondingly decreased.

On the other hand, the determination circuit 1601 can receive the voltage coefficient Cd from the voltage coefficient configuration circuit 1603. The determination circuit 1601 can transmit an instruction signal to instruct the voltage coefficient configuration circuit 1603 to perform actions of gradually decreasing (or gradually increasing) the voltage coefficient Cd. Further, the determination circuit 1601 can also transmit another instruction signal to notify the voltage coefficient configuration circuit 1603 that the current voltage coefficient Cd is the first boundary voltage coefficient Cmax or the second boundary voltage coefficient Cmin. The voltage coefficient configuration circuit 1603 can correspondingly transmit the first boundary voltage coefficient Cmax and/or the second boundary voltage coefficient Cmin to a register (e.g., the register 14034 in FIG. 14) for temporary storage. In this embodiment of the disclosure, the register may be divided into two layers, one of which is used to store the first boundary voltage coefficient Cmax, whereas another one is used to store the second boundary voltage coefficient Cmin.

In addition, the memory device 1605 is coupled to the determination circuit 1601, and the determination circuit 1601 can store data required during operations (e.g., the logic values of the first comparison results) to the memory device 1605. The counter 1604 is coupled to the memory device 1605, and configured to count the number of the first (valid) comparison results.

In the foregoing embodiments, the determination circuits 1501 and 1601 may be designed through Hardware Description Language (HDL) or any other design methods for digital circuit well-known to persons with ordinary skill in the art, and may be implemented in ways of Field Programmable Gate Array (FPGA), Complex Programmable Logic Device (CPLD) or Application-specific Integrated Circuit (ASIC) hardware circuit methods, there are no specific limitations.

Figure 17:
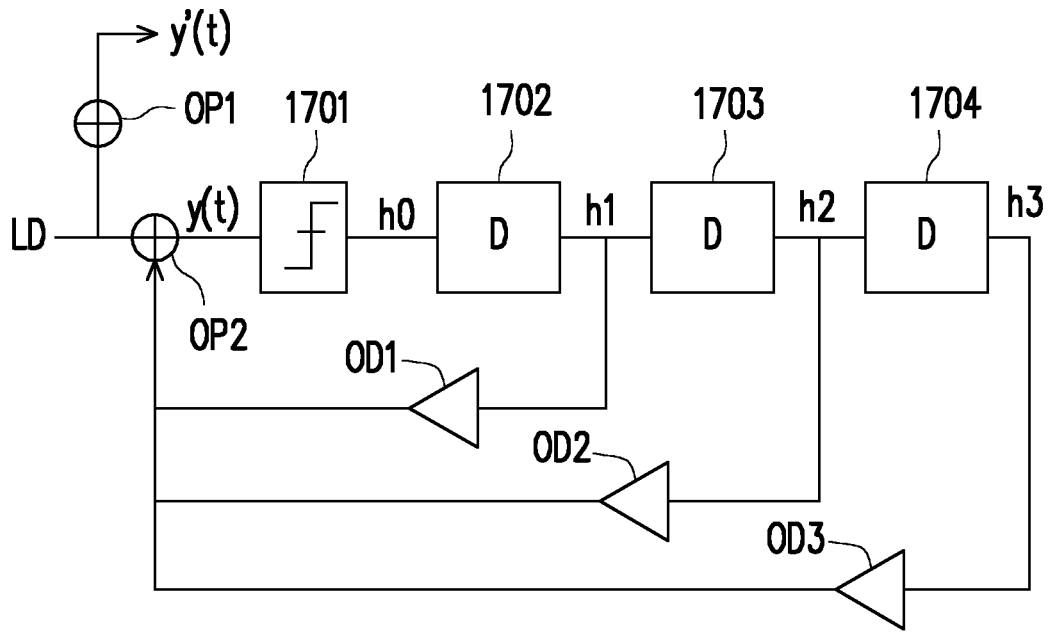
FIG. 17 is a block diagram illustrating the equalizer applied in the reference voltage generator according to an embodiment of the disclosure.

With reference to FIG. 17, FIG. 17 is a block diagram illustrating the equalizer applied in the reference voltage generator according to an embodiment of the disclosure. An equalizer 1700 includes operators OP1 and OP2, a slicer 1701, delay cells 1702 to 1704 and output drivers OD1 to OD3. The operator OP2 receives lossy data LD and output signals of the output drivers OD1 to OD3 for operation, and generates an input signal y(t) of the foreground reference voltage generator. The slicer 1701, the delay cells 1702 to 1704 are sequentially coupled in series, and the output drivers OD1 to OD3 are coupled between output terminals of the delay cells 1702 to 1704 and the operator OP2, respectively. In addition, the operator OP1 receives the lossy data LD to be used to generate another input signal y'(t) which may be used as the input signal of the background reference voltage generator.

In summary, the disclosure provides the detecting voltage that is adjustable step by step for finding the minimum value and the maximum value of the input signal sampled amplitudes so the reference voltage can be calculated according to the minimum value and the maximum value of the input signal sampled amplitudes. As a result, an accurate reference voltage may be provided to the equalizer to improve a working performance of the equalizer.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims.

What is claimed is:

1. A reference voltage generator, adapted for an equalizer, comprising:
a detecting voltage provider, configured to provide a detecting voltage, the detecting voltage having a first voltage level corresponding to a voltage coefficient;
a comparator, coupled to the detecting voltage provider, and configured to compare the first voltage level of the detecting voltage with a plurality of sampled amplitudes of an input signal to respectively generate a plurality of comparison results; and
a core circuit, coupled to the detecting voltage provider and the comparator, and configured to:
collect a plurality of first comparison results associated with a current received bit of a preset value from the comparison results;
take the voltage coefficient as a first boundary voltage coefficient in response to the first comparison results satisfying a first condition;
take the voltage coefficient as a second boundary voltage coefficient in response to the first comparison results satisfying a second condition;
operate an arithmetical operation on the first boundary voltage coefficient and the second boundary voltage coefficient to generate a reference voltage coefficient;
when none or merely one of conditions among the first condition and the second condition occurred, generate the voltage coefficient corresponding to a second voltage level, and output the voltage coefficient corresponding to the second voltage level to the detecting voltage provider, wherein the first voltage level is different from the second voltage level, wherein the reference voltage generator generates a reference voltage for the equalizer according to the reference voltage coefficient.

2. The reference voltage generator according to claim 1, wherein the core circuit comprises:
   a selector, configured to selectively output one of the voltage coefficient and the reference voltage coefficient corresponding to the reference voltage according to a selecting signal;
   a controller, configured to:
      collect the first comparison results associated with the current received bit of the preset value from the comparison results;
      generate the first boundary voltage coefficient and the second boundary voltage coefficient;
      generate the voltage coefficient corresponding to the second voltage level to the detecting voltage provider; and
      generate the selecting signal to the selector; and
   an arithmetical circuit, configured to operate the arithmetical operation.

3. The reference voltage generator according to claim 2, wherein the controller comprises:
   a determination circuit, configured to:
      collect the first comparison results associated with the current received bit of the preset value from the comparison results;
      determine whether the first comparison results satisfy a preconfigured condition to generate a resultant signal, wherein the preconfigured condition is the first condition or the second condition; and
      generate the selecting signal to the selector after the first boundary voltage coefficient and the second boundary voltage coefficient are determined; and
   a voltage coefficient configuration circuit, configured to:
      according to the resultant signal, perform at least one of below actions: (1) generating the voltage coefficient corresponding to the second voltage level, and (2) taking the voltage coefficient as a boundary voltage coefficient, wherein the boundary voltage coefficient is the first boundary voltage coefficient or the second boundary voltage coefficient.

4. The reference voltage generator according to claim 1, wherein the detecting voltage provider is configured to generate the reference voltage for the equalizer according to a reference voltage coefficient calculated based on the first boundary voltage coefficient and the second boundary voltage coefficient.

5. The reference voltage generator according to claim 1, further comprising:
   a voltage generator, coupled to the core circuit and configured to generate the reference voltage for the equalizer according to a reference voltage coefficient calculated based on the first boundary voltage coefficient and the second boundary voltage coefficient.

6. The reference voltage generator according to claim 1, wherein the preset value of the current received bit is 1 or 0.

7. The reference voltage generator according to claim 1, wherein when the reference voltage to be generated is a positive reference voltage, the first condition is all of a plurality of first comparison results in a first previous scan cycle indicating that a previous voltage level of the detecting voltage is greater than the corresponding sampled amplitude being changed to at least one of the first comparison results in a first current scan cycle indicating that the first voltage level of the detecting voltage is less than or equal to the corresponding sampled amplitude, and the second condition is that a part of first comparison results in a second pervious scan cycle indicating that a previous voltage level of the detecting voltage is less than or equal to the corresponding sampled amplitude being changed to all of the first comparison results in a second current scan cycle indicating that the first voltage level of the detecting voltage is less than or equal to the corresponding sampled amplitude.

8. The reference voltage generator according to claim 1, wherein when the reference voltage to be generated is a positive reference voltage, the first condition is all of a plurality of first comparison results in a first previous scan cycle indicating that a previous voltage level of the detecting voltage is less than the corresponding sampled amplitude being changed to at least one of the first comparison results in a first current scan cycle indicating that the first voltage level of the detecting voltage is greater than or equal to the corresponding sampled amplitude, and the second condition is a part of first comparison results in a second pervious scan cycle indicating that a previous voltage level of the detecting voltage is greater than or equal to the corresponding sampled amplitude being changed to all of the first comparison results in a second current scan cycle indicating that the first voltage level of the detecting voltage is greater than or equal to the corresponding sampled amplitude.

9. The reference voltage generator according to claim 1, wherein when the reference voltage to be generated is a negative reference voltage, the first condition is all of a plurality of first comparison results in a first previous scan cycle indicating that a previous voltage level of the detecting voltage is less than the corresponding sampled amplitude being changed to at least one of the first comparison results in a first current scan cycle indicating that the first voltage level of the detecting voltage is greater than or equal to the corresponding sampled amplitude, and the second condition is a part of first comparison results in a second pervious scan cycle indicating that a previous voltage level of the detecting voltage is greater than or equal to the corresponding sampled amplitude being changed to all of the first comparison results in a second current scan cycle indicating that the first voltage level of the detecting voltage is greater than or equal to the corresponding sampled amplitude.

10. The reference voltage generator according to claim 1, wherein when the reference voltage to be generated is a negative reference voltage, the first condition is all of a plurality of first comparison results in a first previous scan cycle indicating that a previous voltage level of the detecting voltage is greater than the corresponding sampled amplitude being changed to at least one of the first comparison results in a first current scan cycle indicating that the first voltage level of the detecting voltage is less than or equal to the corresponding sampled amplitude, and the second condition is a part of first comparison results in a second pervious scan cycle indicating that a previous voltage level of the detecting voltage is less than or equal to the corresponding sampled amplitude being changed to all of the first comparison results in a second current scan cycle indicating that the first voltage level of the detecting voltage is less than or equal to the corresponding sampled amplitude.

11. A reference voltage generator, adapted for an equalizer, comprising:
a detecting voltage provider, configured to provide a detecting voltage, the detecting voltage having a first voltage level corresponding to a voltage coefficient;
a comparator, coupled to the detecting voltage provider, and configured to compare the first voltage level of the detecting voltage with a plurality of sampled amplitudes of an input signal to respectively generate a plurality of comparison results; and
a core circuit, coupled to the detecting voltage provider and the comparator, and configured to:
collect a plurality of first comparison results associated with a current received bit of a preset value from the comparison results;
take the voltage coefficient as a first boundary voltage coefficient in response to the first comparison results satisfying a first condition;
take the voltage coefficient as a second boundary voltage coefficient in response to the first comparison results satisfying a second condition;
replace the second boundary voltage coefficient by the voltage coefficient in response to two situations below being true: (1) a second comparison result corresponding to the current received bit satisfies a third condition, and (2) a plurality of received bits match a preconfigured bit sequence pattern;
when none or merely one of conditions among the first condition and the second condition occurred, or when both the first condition and the second condition occurred and yet at least one of the situations (1) and (2) is not true, generate the voltage coefficient corresponding to a second voltage level, and output the voltage coefficient corresponding to the second voltage level to the detecting voltage provider, wherein the first voltage level is different from the second voltage level,
wherein the reference voltage generator generates a reference voltage for the equalizer according to the first boundary voltage coefficient and the second boundary voltage coefficient.

12. The reference voltage generator according to claim 11, wherein the core circuit comprises:
a selector, configured to selectively output one of the voltage coefficient and a reference voltage coefficient corresponding to the reference voltage according to a selecting signal;
a controller, configured to:
collect the first comparison results associated with the current received bit of the preset value from the comparison results;
generate the first boundary voltage coefficient and the second boundary voltage coefficient;
generate the voltage coefficient corresponding to the second voltage level to the detecting voltage provider; and
generate the selecting signal to the selector; and
an arithmetical circuit, configured to operate an arithmetical operation on the first boundary voltage coefficient and the second boundary voltage coefficient to generate the reference voltage coefficient.

13. The reference voltage generator according to claim 12, wherein the controller comprises:
a filter, configured to:
obtain the received bits;
determine whether the received bits match the preconfigured bit sequence pattern; and
output a match result to indicate whether the received bits match the preconfigured bit sequence pattern;
a determination circuit, configured to:
collect the first comparison results associated with the current received bit of the preset value from the comparison results;
determine whether the first comparison results satisfy a preconfigured condition to generate a first resultant signal, wherein the preconfigured condition is the first condition or the second condition;
determine whether the second comparison result corresponding to the current received bit satisfies the third condition to generate a second resultant signal; and
generate the selecting signal to the selector after the first boundary voltage coefficient and the second boundary voltage coefficient are determined; and
a voltage coefficient configuration circuit, configured to:
according to the first resultant signal, the second resultant signal and the match result, execute at least one of following actions: (1) generating the voltage coefficient corresponding to the second voltage level, and (2) taking the voltage coefficient as a boundary voltage coefficient, wherein the boundary voltage coefficient is the first boundary voltage coefficient or the second boundary voltage coefficient.

14. The reference voltage generator according to claim 11, wherein the detecting voltage provider is configured to generate the reference voltage for the equalizer according to a reference voltage coefficient calculated based on the first boundary voltage coefficient and the second boundary voltage coefficient.

15. The reference voltage generator according to claim 11, further comprising:
a voltage generator, coupled to the core circuit and configured to generate the reference voltage for the equalizer according to a reference voltage coefficient calculated based on the first boundary voltage coefficient and the second boundary voltage coefficient.

16. The reference voltage generator according to claim 11, wherein the preset value of the current received bit is 1 or 0.

17. The reference voltage generator according to claim 11, wherein when the reference voltage to be generated is a positive reference voltage, the first condition is all of a plurality of first comparison results in a first previous scan cycle indicating that a previous voltage level of the detecting voltage is greater than the corresponding sampled amplitude being changed to at least one of the first comparison results in a first current scan cycle indicating that the first voltage level of the detecting voltage is less than or equal to the corresponding sampled amplitude,
and the second condition is a part of first comparison results in a second pervious scan cycle indicating that a previous voltage level of the detecting voltage is less than or equal to the corresponding sampled amplitude being changed to all of the first comparison results in a second current scan cycle indicating that the first voltage level of the detecting voltage is less than the corresponding sampled amplitude.

18. The reference voltage generator according to claim 11, wherein when the reference voltage to be generated is a positive reference voltage, the first condition is all of a plurality of first comparison results in a first previous scan cycle indicating that a previous voltage level of the detecting voltage is less than the corresponding sampled amplitude being changed to at least one of the first comparison results in a first current scan cycle indicating that the first voltage level of the detecting voltage is greater than or equal to the corresponding sampled amplitude, and the second condition is a part of first comparison results in a second pervious scan cycle indicating that a previous voltage level of the detecting voltage is greater than or equal to the corresponding sampled amplitude being changed to all of the first comparison results in a second current scan cycle indicating that the first voltage level of the detecting voltage is greater than the corresponding sampled amplitude.

19. The reference voltage generator according to claim 11, wherein when the reference voltage to be generated is a negative reference voltage, the first condition is all of a plurality of first comparison results in a first previous scan cycle indicating that a previous voltage level of the detecting voltage is less than the corresponding sampled amplitude being changed to at least one of the first comparison results in a first current scan cycle indicating that the first voltage level of the detecting voltage is greater than or equal to the corresponding sampled amplitude, and the second condition is a part of first comparison results in a second pervious scan cycle indicating that a previous voltage level of the detecting voltage is greater than or equal to the corresponding sampled amplitude being changed to all of the first comparison results in a second current scan cycle indicating that the first voltage level of the detecting voltage is greater than the corresponding sampled amplitude.

20. The reference voltage generator according to claim 11, wherein when the reference voltage to be generated is a negative reference voltage, the first condition is all of a plurality of first comparison results in a first previous scan cycle indicating that a previous voltage level of the detecting voltage is greater than the corresponding sampled amplitude being changed to at least one of the first comparison results in a first current scan cycle indicating that the first voltage level of the detecting voltage is less than or equal to the corresponding sampled amplitude, and the second condition is a part of first comparison results in a second pervious scan cycle indicating that a previous voltage level of the detecting voltage is less than or equal to the corresponding sampled amplitude being changed to all of the first comparison results in a second current scan cycle indicating that the first voltage level of the detecting voltage is less than the corresponding sampled amplitude.

21. The reference voltage generator according to claim 11, wherein when the reference voltage to be generated is a positive reference voltage, the third condition is the second comparison result corresponding to the current received bit indicating that the first voltage level of the detecting voltage is less than or equal to the corresponding sampled amplitude.

22. The reference voltage generator according to claim 11, wherein when the reference voltage to be generated is a positive reference voltage, the preconfigured bit sequence pattern is a bit 0 sequence.

23. The reference voltage generator according to claim 11, wherein when the reference voltage to be generated is a negative reference voltage, the third condition is the second comparison result corresponding to the current received bit indicating that the first voltage level of the detecting voltage is greater than or equal to the corresponding sampled amplitude.

24. The reference voltage generator according to claim 11, wherein when the reference voltage to be generated is a positive reference voltage, the preconfigured bit sequence pattern is a bit 1 sequence.

* * * * *